(12) United States Patent
Terao et al.

(10) Patent No.: US 7,829,930 B2
(45) Date of Patent: Nov. 9, 2010

(54) SEMICONDUCTOR DEVICE WITH ION MOVEMENT CONTROL

(75) Inventors: Motoyasu Terao, Hinode (JP);
Hideyuki Matsuoka, Nishitokyo (JP);
Naohiko Irie, Kokubunji (JP);
Yoshitaka Sasago, Tachikawa (JP);
Riichiro Takemura, Los Angeles, CA (US); Norikatsu Takaura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 142 days.

(21) Appl. No.: 12/169,789

(22) Filed: Jul. 9, 2008

(65) Prior Publication Data

US 2009/0014770 A1 Jan. 15, 2009

(30) Foreign Application Priority Data

Jul. 12, 2007 (JP) ............................. 2007-183409

(51) Int. Cl.
*H01L 27/108* (2006.01)

(52) U.S. Cl. ............................. 257/314; 257/E29.001; 257/E31.027; 257/E31.029

(58) Field of Classification Search ................. 257/314, 257/E29.001, 315, E31.027, E31.029
See application file for complete search history.

(56) References Cited

U.S. PATENT DOCUMENTS 5,789,758 A * 8/1998 Reinberg ........................ 257/3
5,825,046 A * 10/1998 Czubatyj et al. ................ 257/2

FOREIGN PATENT DOCUMENTS

JP 2006-173267 A 6/2006

OTHER PUBLICATIONS

Araya Katsuhisa, Machine Translation of JP 2006-173267 filed Jul. 9, 2008 in IDS.*
Sakamoto et al. "A Nonvolatile Programmable Solid Electrolyte Nanometer Switch", IEEE International Solid-State Circuits Conference 2004, Session 16, p. 16.3.
Kozicki et al. "Non-Volatile Memory Based on Solid Electrolytes", IEEE 2004, Proc. Non-Volatile Memory Technology Symposium (MVMTS), pp. 10-17.

* cited by examiner

*Primary Examiner*—Wael M Fahmy
*Assistant Examiner*—John C Ingham
(74) *Attorney, Agent, or Firm*—Miles & Stockbridge P.C.

(57) ABSTRACT

A technique that can realize high integration even for multi-layered three-dimensional structures at low costs by improving the performance of the semiconductor device having recording or switching functions by employing a device structure that enables high precision controlling of the movement of ions in the solid electrolyte. The semiconductor element of the device is formed as follows; two or more layers are deposited with different components respectively between a pair of electrodes disposed separately in the vertical (z-axis) direction, then a pulse voltage is applied between those electrodes to form a conductive path. The resistance value of the path changes according to an information signal. Furthermore, a region is formed at a middle part of the conductive path. The region is used to accumulate a component that improves the conductivity of the path, thereby enabling the resistance value (rate) to response currently to the information signal. More preferably, an electrode should also be formed at least in either the x-axis or y-axis direction to apply a control voltage to the electrode.

18 Claims, 18 Drawing Sheets

SEMICONDUCTOR DEVICE WITH ION MOVEMENT CONTROL

CLAIM OF PRIORITY

The present application claims priority from Japanese patent application JP 2007-183409 filed on Jul. 12, 2007, the content of which is hereby incorporated by reference into this application.

FIELD OF THE INVENTION

The present invention relates to a semiconductor device, more particularly to a technique to be applied effectively to semiconductor devices provided with a memory element respectively.

BACKGROUND OF THE INVENTION

There are some types of well-known non-volatile memories referred to as RRPMs, ReRAMs, solid electrolyte memories, or polarized memories (e.g., refer to JP-A 2006-173267, T. Sakamoto et al "IEEE International Solid-State Circuits Conference (ISSCC) 2004", Digest, (issued in USA), 2004, p 16.3, and M. N. Kozicki et al "Proc. Non-Volatile Memory Technology Symposium (MVMTS) 2004)", (issued in USA), 2004, pp. 10 to 17). In most of those non-volatile memories, each item of information is written therein according to a change of the resistance of the object recording element and such a resistance change is made in accordance with the direction of the voltage applied to the recording element. Each non-volatile memory enables information to be rewritten therein at a low voltage and at a low power. In those non-volatile memories, a resistance value that changes by more than one digit is used as a signal, thereby large read signals can be used and accordingly the signal sensing is easy.

SUMMARY OF THE INVENTION

The present inventor, as a result of examinations, has reached the following conclusion with respect to the typical one of the non-volatile memories described above.

Concretely, in case of a metal-chalcogenide or metal-oxide solid electrolyte memory in which chalcogenide or oxide is used to form a solid electrolytic layer to be disposed between a pair of electrodes, ions move in accordance with the memory mechanism and a low resistance conductive path is formed in the chalcogenide layer or oxide layer to realize a non-volatile memory. The conductive path contains highly concentrated plus ions of such an element as Ag, Cu, or the like. And when those ions are return toward the original electrode with a backward voltage, the conductive path restores its high resistance state, thereby enabling information rewriting in the memory.

If such information rewriting is repeated in the memory, however, metal ions are diffused unevenly in the solid electrolytic layer from the metal electrodes. As a result, the shape of the surface of the electrodes comes to change on the atomic level, causing the rewriting characteristics to become unstable, thereby the resistance might change at each rewriting time. Furthermore, while rewriting is repeated, the Ag and Cu come to be concentrated excessively due to their diffusion from the electrodes, thereby the surface shapes of the electrodes might not change with the resistance between ON and OFF states. Although the high resistance state (OFF) can also be set with a high voltage/current that might generate a heat in some cases even when the voltage direction is the same as the resistance lowering one, the metal ion concentration in the solid electrolyte is further quickened by the repetitive rewriting. The rewriting endurance is thus more lowered. In addition, the resistance of the conductive path easily varies among memory elements. Consequently, those causes come to degrade the performance of the subject information recordable semiconductor device and it will become difficult to realize larger capacity and higher integration in memories by multi-value/multi-bit recording techniques.

Under such circumstances, it is an object of the present invention to provide a technique that enables coexistence of both logic elements and memory elements in a highly integrated recordable semiconductor device. The semiconductor device is structured so as to control movements of ions in the solid electrolyte very precisely, thereby improving its performance. The semiconductor device is required to have just one layer for transistors or diodes even when it is structured as a multilayered three-dimensional one or required to have only diodes at points of X-Y intersection in the array on each layer, so that the high integration comes to be realized at a low cost.

The above and further objects and novel features of the present invention will more fully appear from the following detailed descriptions when the same is read in conjunction with the accompanying drawings.

Hereunder, there will be described typical one of the objects of the present invention to be disclosed in this specification briefly.

The semiconductor of the present invention includes an upper electrode of which main component is an element diffusible in a recording layer (solid electrolytic layer) (the content is over 50 atomic %, more preferably over 60 atomic %) The recording layer disposed between the upper electrode and its counterpart lower electrode consists of two or more layers. The cathode (eg., the lower electrode) side layer is set lower than that of the anode (e.g., the upper electrode) side layer in mobility (defined just like the mobility of such carriers as electrons in a semiconductor) of the element of the main component of the anode electrode that contributes more to form a conductive path. Consequently, the conductive path is formed with ions pushed forcibly into the path, which is then extended down from the anode to be shaped like an electric wire or filament, thereby the lower electrode is connected/disconnected according to the direction of the applied voltage or how the voltage is applied (e.g., pulse width, pulse voltage, etc.). On the contrary, for example, according to the technique disclosed in T. Sakamoto et al "IEEE International Solid-State Circuits Conference (ISSCC) 2004", Digest, (issued in USA), 2004, p 16.3, only one solid electrolytic layer is provided. And because the mobility of the anode element is high, the highly concentrated ion conductive path can keep the connection to the anode even when the metal ions are diffused from the anode into the solid electrolyte, thereby the highly concentrated ion conductive path is prevented from extension to the cathode. As a result, moved ions are accumulated around the cathode and the ion concentration is raised there. Furthermore, the conductive region rises towards the anode gradually to be shaped like a cone. And when the region reaches the anode, the cathode and the anode are connected electrically to each other. In this case, the cathode and the anode are disconnected if the ions around the peak of the cone-shaped region are removed by an applied backward voltage and the cone is lowered. The base of the cone-like region might become wider than the traversal width of the lower electrode to cause troubles in the high integration process of the semiconductor device.

In case of the semiconductor device of the present invention, because the above-described wire-like or filament-like conductive path can be controlled in the forming process, the semiconductor device can realize excellent performance and various functions as to be described below. And similarly to the above-described conventional technique, it is also possible here to use a material that contains conductivity improving ions and atoms to be accumulated at the phase boundary with its counterpart electrode or its facing layer (assumed to be positioned lower than the anode) and grown upward to form a conductive path, although the performance is lower than that of the present invention described above.

In order to realize a difference of the mobility among elements that contribute to the forming of a conductive path in such a way, the present inventor has had a notation of making a difference among the gaps of atomic arrays through which an element useful to form such a conductive path, as well as a difference of the attracting and coupling forces between an element useful to form the conductive path and an element used to form a recording layer. The solid electrolytic layer often contains elements of six groups. And because the radius of atoms and ions becomes larger in the order of oxygen, sulfur, selenium, and tellurium that are listed up vertically in the periodic law table, metal ions can pass easily among any of those elements, that is, the mobility of metal ions becomes higher. In this case, it is premised that the elements of the six groups couple with the same element. In case of a nitride that contains elements of five groups, the mobility is considered to be approximately the same as that in oxide.

Here, mobility means easiness for metal ions to pass through a solid electrolyte material and conductivity means easiness for carriers to pass through a conductive path formed with metal ions or through a solid electrolytic layer.

If one of two solid electrolytic layers has high conductivity, the area can be reduced and used partly as one electrode. The other layer comes to have low ion mobility. In this case, the ions come to form a thin wire-like or filament-like conductive path.

In an example, the semiconductor device of the present invention is provided with still another electrode in addition to the upper and lower electrodes. The device configuration is as follows at this time.

(1) If it is assumed that the direction of the subject high conductivity path formed between the upper and lower electrodes is the Z-axis direction, another electrode is provided in the Y-axis direction that is almost orthogonal to the Z-axis direction. Furthermore, still another electrode is formed so as to pass both sides of the high conductivity (conductive) path in the X-axis direction that is almost orthogonal to those Z-axis and Y-axis directions.

FIG. 1 shows an example of a typical structure of one memory cell arrayed in an X-Y in-plane matrix. The width, height, shape, intervals, and sizes of holes formed in those electrodes are simplified so as to be understood easily, so that those shown in FIG. 1 might not be the same as real ones. For example, in case of a flash memory, the width and height of the read electrode are almost the same as the minimum thickness of the plug electrode, so that they are determined to be about 90 nm in thickness according to the present designing rule. For example, in case where Y-axis direction electrodes are added to the semiconductor device, the size of memory cells becomes about $2\times4F^2=8F^2$. In case where X-axis direction electrodes are added to the semiconductor device, the size of memory cells can be kept as is if the conductive path is passed through the holes of those electrodes. Consequently, very high integration is realized in the semiconductor device if a multi-bit or multi-value system is employed. As shown in FIG. 1, if the Y-axis direction electrodes are formed so that the conductive path passes through the holes of those electrodes, it might be possible to reduce the area more than $8F^2$. In FIG. 1, each of the two electrodes are divided into two around the conductive path and have a hole. In this case, the cross sectional area that includes the sum of the two-divided portions should preferably be almost the same (within +/−20%, more preferably within +/−20%) between those electrodes. However, the condition might differ depending on how the electrode functions. For example, if heat generation is utilized, the sum of the two cross sectional areas of the two-divided portions around the conductive path should preferably be smaller than the cross sectional area of the not-divided portion so as to make it easier to generate the heat. If an electrode is completely divided into two electrodes, the above case can apply similarly to the sum of the cross sectional areas of the two divided electrodes.

Each X-axis direction electrode may be divided into two electrodes passing different sides of a high conductivity path respectively; the conductivity differs between those sides of the path. Each of the divided electrodes may also function partly as an electrode passing one side of another adjacent Z-axis direction conductive path. In this case, at least one X-axis direction electrode comes to be disposed between each pair of conductive paths.

In each example shown above, at least either the X-axis or Y-axis electrodes may be omitted.

(2) The semiconductor device includes means that controls the resistance in each portion of the above high conductivity path by applying a voltage to at least either the X-axis or Y-axis electrodes. In other words, the semiconductor device includes a power supply circuit, a pulse generation circuit, a pulse waveform/voltage determination logic circuit, an X-axis/Y-axis direction electrode selection circuit.

The X-axis, Y-axis, and Z-axis should preferably be orthogonal to each another, but they may also be diagonal to each another. In the middle of the conductive path shown in FIG. 1, a top-shaped swelled portion is formed around the phase boundary between the above-described two layers. The top-shaped swelled portion (where a conductivity improving component is accumulated) 4 is not formed in some cases. It is possible to relate whether to form the top-shaped portion to an information signal.

The size may be the same or different among all the top-shaped swelled portions. Basically, each conductive region denoted with a spotted pattern is not connected electrically to any of the X-axis and Y-axis directions. This means that the resistance generated between those electrodes is not low. However, if the contact of a top-shaped portion with a Y-axis direction electrode is used to read data therefrom, the resistance between the Z-axis direction conductive region and the Y-axis electrode is low in that portion. The Y-axis direction electrode can also be used to suppress the spreading of ions in the X-axis direction. Because FIG. 1 is a concept one, the sizes of the X-axis, Y-axis, and Z-axis are not necessarily the same as the real ones.

(3) In the upper and lower electrodes in the Z-axis direction are disposed two wirings; one above the upper electrode and the other below the lower electrode. And a transistor or diode is disposed at each point of X-Y intersection shown in the circuit diagram just like ordinary matrix driving memories. Here, it should preferably be assured that rewriting can be made many times stably even when the resistance is switched between low and high (ON and OFF) with the application of the same direction voltage so as to enable the driving of the matrix in which diodes are disposed instead of transistors; the diodes can be formed more simply in structure and disposed in smaller areas than transistors. In order to meet such s demand, the following structure and driving means are employed for the semiconductor device. When turning off a conductive path with the application of the same direction voltage or before/after the turning-off, it is also preferable to apply a voltage to the object X-axis or Y-axis electrode so as to assist the conductor path to be disconnected.

If this same direction voltage application is employed only to stabilize the driving, the Y-axis direction electrodes may be omitted; the X-axis electrodes alone will be enough.

Concretely, as shown in FIG. 3, the X-axis direction electrodes 56 are disposed so as to pass near the conductive path side end of one of the electrodes disposed at both sides of the conductive path 52. Particularly it is preferable that the range from the upper end to the lower end of the pair of X-axis direction electrodes 56 in the Z-axis direction is almost on the same level of one end (closer to the conductive path) of one of the electrodes disposed at both sides of the conductive path 52 (the Z-axis coordinates are almost the same between them). It is more preferable if the X-axis direction electrodes 56 are disposed so as to pass both sides 55 of the conductive path around the conductive path side end of one of the X-axis direction electrodes disposed at both sides of the conductive path. The X-axis direction electrodes may be united into one after passing both sides of the conductive path around the conductive path side end of one of the electrodes disposed at both sides of the conductive path. Those X-axis electrodes may also be kept separated as are.

In order to keep the constant state of the distribution of the above-described conductivity improving material, a voltage may be applied to an X-axis direction electrode at a predetermined Y coordinate point. However, the voltage should preferably be applied to many electrodes in the X-axis direction simultaneously so as to make the voltage application efficiently between writing or reading operations. In this case, it is avoided that the conductivity improving material (e.g., ions) is distributed unevenly among memory cells due to many times of rewriting. And in order to prevent the problem, it is preferable to carry out code conversion each time writing is to be carried out. The code conversion enables values of information to be written (e.g., '1' and '0' of digital data) almost evenly among memory cells when the values are averaged after a predetermined number of writing operations are carried out. (The average value also includes that of time intervals for applying a voltage to, for example, X-axis direction electrodes.)

In order to improve the integration degree more, the following means are employed to record multiple values and/or multiple bits in the film thickness direction.

(1) A high conductivity path is formed between the above pair of electrodes so that the resistivity in the middle of the path changes according to an information signal.

(2) A region 54 is formed in the middle of the high conductivity path and used to accumulate a conductivity improving component and accordingly, the resistivity between any pair of electrodes is related to the information signal.

FIG. 19 shows an example of the structure of a three-dimensional multi-bit memory. FIG. 19 shows part of the three-dimensional structure that appears repetitively in a wide range. In each portion denoted with a spotted pattern is highly concentrated the conductivity improving component (ions or atoms). And in each top-shaped swelled portion is accumulated the conductivity improving component corresponding to data. The size may be the same or different among all the top-shaped portions. Basically, the conductive regions denoted with spotted patterns respectively in the Z-axis direction, as well as the electrodes in the X-axis and Y-axis directions are not connected electrically to each another. This means that the resistance among them is not low.

Upon reading with use of the contact of a top-shaped accumulating portion with an electrode in the Y-axis direction, the resistance between the conductive region in the Z-axis direction and the electrode in the Y-axis direction is lowered at the contact portion. All the eight electrodes in the X-axis direction shown in the figure have a hole respectively. The ion conductive path passes through each of those holes. Each electrode in the Y-axis direction is used to suppress the spreading of ions in the X-axis direction. Because the figure is a concept one, the sizes of the X-axis, Y-axis, and Z-axis in the drawing are not identical to their real sizes. The real sizes are obtained by reducing them in the Z-axis direction shown in the figure. The height, shape, disposition intervals of the electrodes, as well as the sizes of the holes formed in those electrodes might differ from those shown in FIG. 19, since they are simplified so as to be understood easily.

Actually, ion accumulation occurs more or less at most of phase boundaries between layers, but the amount of accumulated ions is less than that in the above high conductivity region in which ions are accumulated intentionally. Such ion accumulated phase boundaries can thus be distinguished from the top-shaped swelled portions.

Although the solid electrolytic layers and the phase boundary between those layers are not shown in the figure, a total of 3×4=12 layers exist in the Z-axis direction within the range shown in FIG. 19. In this situation, the top-shaped swelled portion is formed jointly by a voltage and by an effect of ion braking that works at each phase boundary between solid electrolytic layers. The voltage is that applied to the upper and lower electrodes provided at the upper end and at the lower end of the ion conductive path, as well as to the electrodes in the Y-axis and X-axis directions, which pass near the region of the ion conductive path. At this time, ions move from top to bottom in FIG. 19.

There is another method for recording data as follows.

(4) A plurality of regions for accumulating a conductivity improving component or portions formed with an angle from a direction connecting the above electrodes are formed between a pair of electrodes.

(5) Each of the above paths is provided with two electrodes disposed in parallel and passing through each layer in parallel to a high conductivity path and those two electrodes are enabled to apply a voltage in a direction with an angle from the direction connecting the two electrodes.

(6) Each recorded information is related to a region of the high conductivity path, in which a conductivity improving component is accumulated or a phase boundary between a direction connecting a pair of electrodes and a portion having an angle from the direction.

The above descriptions can be summarized as follows.

In the semiconductor device, two or more layers having different components respectively are formed between a pair of electrodes disposed separately in the vertical direction (Z-axis direction) and a pulse voltage is applied between those electrodes to form a conductive path. The conductive path is assumed as a semiconductor element capable of changing its resistance value according to information to be recorded. Furthermore, a region that accumulates a conductivity improving component is formed in the middle of the conductive path, thereby relating the resistivity of the conductive path to an information signal correctly. And preferably, an electrode should be formed at least in either the X-axis or Y-axis direction and a control voltage should be applied to the electrode. Consequently, ions diffused from the upper electrode are returned moderately toward the upper electrode, thereby the element on/off operations can be repeated many times stably with the voltage in the same direction (the Z-axis direction). As a result, instead of a transistor, a diode can be formed at each point of X-Y intersection of the subject memory array and the memory array can be driven at a low cost. This technique can also apply to multi-value recording correctly. The resistance between the upper electrode in the Z-axis direction and an X-axis direction electrode, as well as an electromotive force generated by electromagnetic induction may also be used to read data. Employment of a three-dimensional matrix also enables multi-bit recording. At least part of the above-described conductive path may also be related to an information signal to be formed with an angle from the direction connecting a pair of electrodes and furthermore, the conductive path may be switched over to, branched to, and jointed into another.

Each of the above descriptions can apply to even a case in which the upper and lower electrodes (substrate side electrodes) are inverted up and down and the descriptions of other up and down items are all inverted.

Some components of the semiconductor device of the present invention may be used as a logic circuit switch between memories, and as branch and join devices that are switches in a broad sense. In case of a switch to be turned on/off with the effect of the third electrode, the control voltage is not applied to the main circuit, so that the switch can be used like an electromagnetic relay switch.

DETAILED DESCRIPTION OF THE PREFERRED EMBODIMENTS

Figure 1:
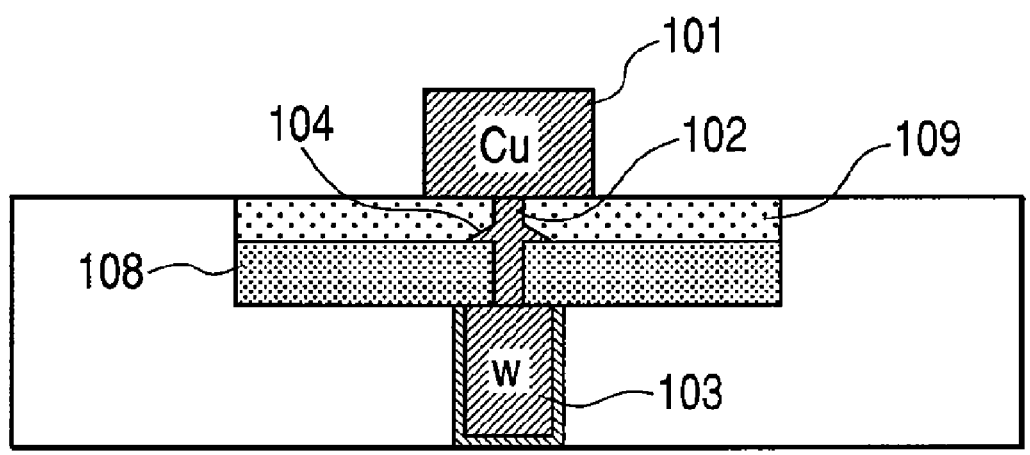
FIG. 1 is a cross sectional view of a basic structure of a memory cell in a semiconductor device of the present invention.

In the following descriptions, the object of the present invention is divided into some sections or embodiments. Unless otherwise notified specially, however, those are related to each another; one might be a variation, details, supplemental description of part or whole of another. And in the embodiments to be described below, numerals of the elements (including the quantities, values, amounts, ranges, etc.) to be referred to are not limited only to specific ones and they are neither over nor under any specific number.

Furthermore, in the following embodiments, needless to say, every component is not necessarily indispensable unless otherwise specially noted and apparently indispensable in principle. Similarly, in the embodiments to be described below, each shape, positional relationship, etc. to be referred to includes those closely resemble or similar practically unless otherwise specially notified and apparently indispensable in principle. This will also apply to the numerals and ranges described above.

Hereunder, there will be described in detail an embodiment of the present invention with reference to the accompanying drawings. In all the drawings, same reference numerals and symbols will be used for same functional components to avoid redundant descriptions.

First Embodiment

In this first embodiment, the semiconductor device includes a memory elements, and the material and structure employed for the memory elements are the main features of the present invention.

(Basic Structure of the Memory Element)

FIG. 1 shows a cross sectional view of the basic structure of a memory element in this first embodiment. The memory element includes a lower electrode 103 formed on a semiconductor substrate; an upper electrode 101 formed on the semiconductor substrate; two layers (solid electrolytic layers 108 and 109) formed on the semiconductor substrate between the upper and lower electrodes 101 and 103. Furthermore, a conductive path is formed in a solid electrolytic layer on a path connecting the upper and lower electrodes to each other and a conductive material accumulating region 104 is formed near the phase boundary between the two solid electrolytic layers.

Figure 2A:
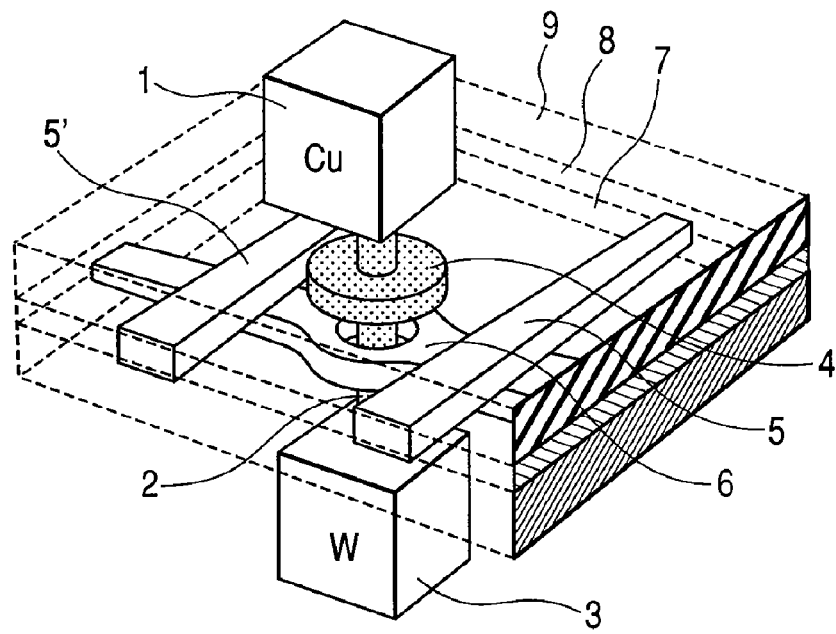
FIGS. 2A and 2B are a bird's eye view of the basic structure of the memory cell in the semiconductor device of the present invention.
Figure 2B:
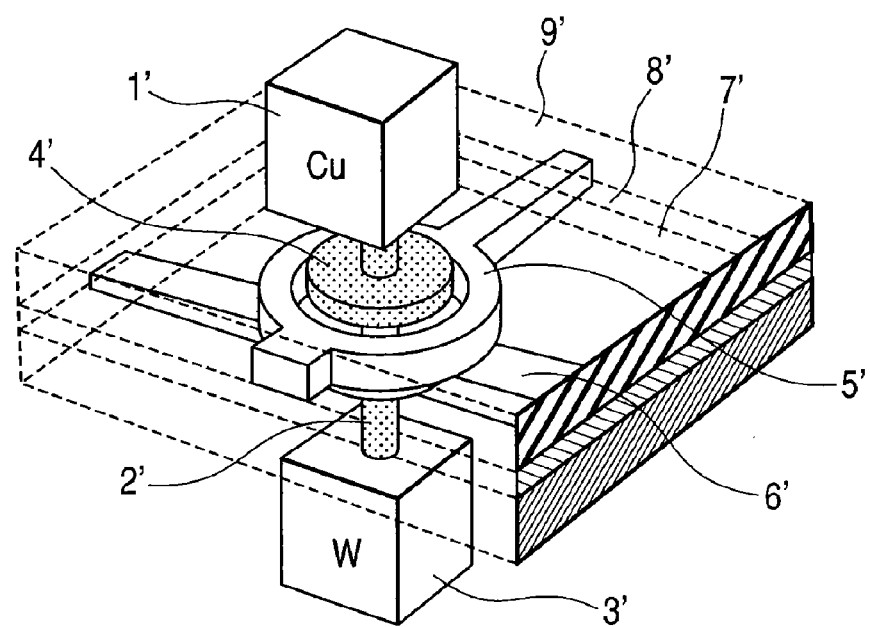

FIG. 2 shows a bird's-eye view of the memory element in this first embodiment. The memory element shown in FIG. 2 differs from the memory element having the basic structure shown in FIG. 1 in that the memory element shown in FIG. 2 is additionally provided with the electrodes disposed in the X-axis and Y-axis directions.

In FIG. 2, two or more layers are formed between the two electrodes 1 and 3 disposed separately in the vertical direction (Z-axis direction). Those layers have different components respectively. Then, a pulse voltage is applied between the electrodes 1 and 3 to form a conductive path 2 of which resistance value changes according to the information to be recorded. Here, it is preferable to form a region 4 that accumulates a conductivity improving component in the middle of the above-described high conductivity path so as to relate the resistivity to an information signal correctly. More preferably, an electrode should also be formed at least in either the X-axis or Y-axis direction. If electrodes are formed in both of the X-axis and Y-axis directions, one electrode closer to the electrode (anode) is referred to as the Y-axis direction and the other electrode closer to the electrode (cathode) is referred to as the X-axis direction electrode upon forming the conductive path 2.

Figure 10:
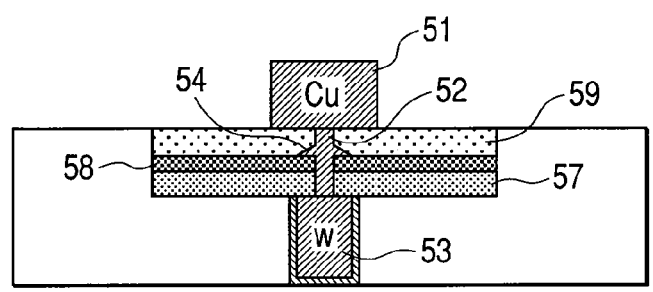
FIG. 10 is a cross sectional view of a basic structure of a memory cell having a phase boundary layer in the semiconductor device of the present invention.

In the example shown in FIG. 2, a 30 nm-thick Cu—Ta—O layer is deposited at first, then a 30 nm-thick Cu—Ta—S layer is deposited on the Cu—Ta—O layer. It is also possible here to deposit a Cu—Ta—S layer, then to use a naturally or forcibly oxidized Cu—Ta—C—S layer instead of the Cu—Ta—C layer. More preferably, a phase boundary layer 58 having a thickness of 1 nm to 10 nm should be deposited between those two layers as shown in FIG. 10. The phase boundary layer 58 should be made of, for example, such fine and chemically stable oxide as $Al_2O_3$. In FIG. 2, the upper electrode 1 is made of Cu and the lower electrode 3 is made of W. While the size and shape are almost the same between those two electrodes 1 and 3, they may be different from each other. The silicon substrate on which transistors are formed may be disposed down or up in FIG. 2. In case of a solid electrolytic memory disclosed in a known document, if a positive voltage is applied to the Cu electrode, the plus ions in the CU are diffused downward. And because there is a difference of Cu ion mobility between those two layers, the movement of the Cu ions is braked once on the phase boundary between those two layers.

If there is a phase boundary layer 58, which resists passing of ions through the layer as shown in FIG. 10, the movement of the Cu ions is braked more apparently. Consequently, an ion-accumulated region comes to be formed on the phase boundary or above the phase boundary layer. A top-shaped portion shown in FIG. 10 is such an ion-accumulated region 54. However, if the next pulse voltage is applied to the region, if the voltage rises more, or if the next higher pulse voltage is applied to the conductive path, the conductive path, passing through the phase boundary layer, is extended downward.

Figure 11:
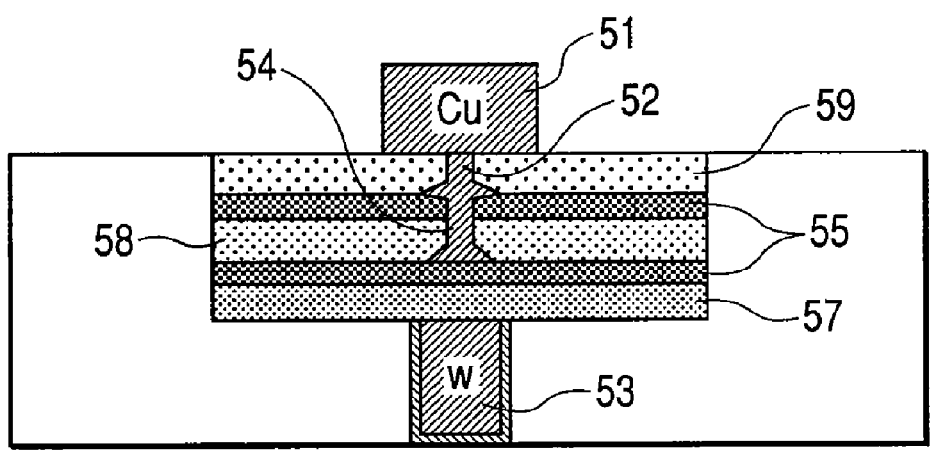
FIG. 11 is a cross sectional view of another basic structure of the memory cell having a phase boundary layer in the semiconductor device of the present invention.

Another electrode 55 having a multilayered structure may be formed so as to apply a voltage not only to the phase boundary layer as shown in FIG. 10, but also to the conductive path 52 between the solid electrolytic layer 59 and the phase boundary layer 58 and between the solid electrolytic layer 57 and the phase boundary layer 58 as shown in FIG. 11.

Figure 12:
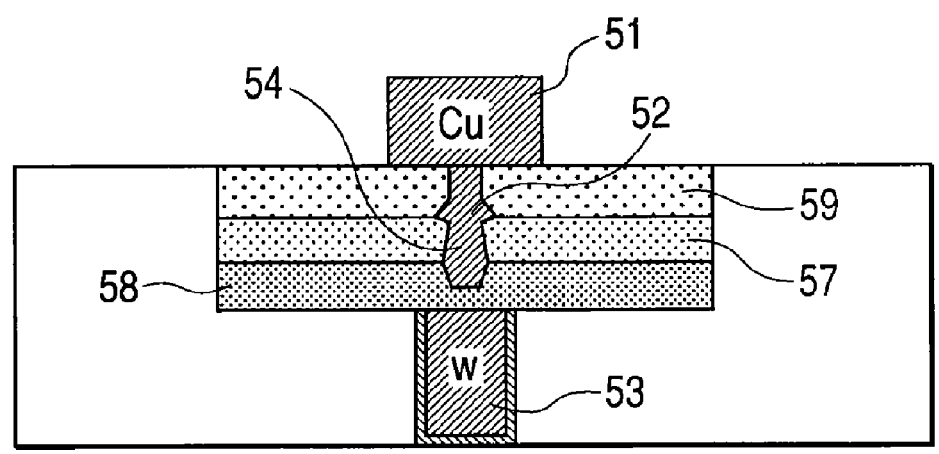
FIG. 12 is a cross sectional view of still another basic structure of the memory cell having a phase boundary layer in the semiconductor device of the present invention.

Furthermore, as shown in FIG. 12, it is also possible to form a phase boundary layer 58 between the lower electrode 53 and a laminated layer consisting of two solid electrolytic layers 59 and 57.

(Setting and Resetting with the Same Direction Voltage)

The semiconductor device can realize cost reduction and multilayered structure favorably as follows. At first, instead of transistors, diodes can be disposed at points of X-Y intersection respectively when the upper end electrode and the lower end electrode in the Z-axis direction are arrayed on the matrix. In this case, it is required to cancel the average movement of the conductivity improving material in multiple rewriting operations and keep the constant state of the distribution of the conductivity improvement material when a voltage is applied to the electrode in the X-axis direction to raise/lower the resistance of the high conductive path, that is, to set/reset the subject memory with the same direction voltage repetitively.

Figure 3:
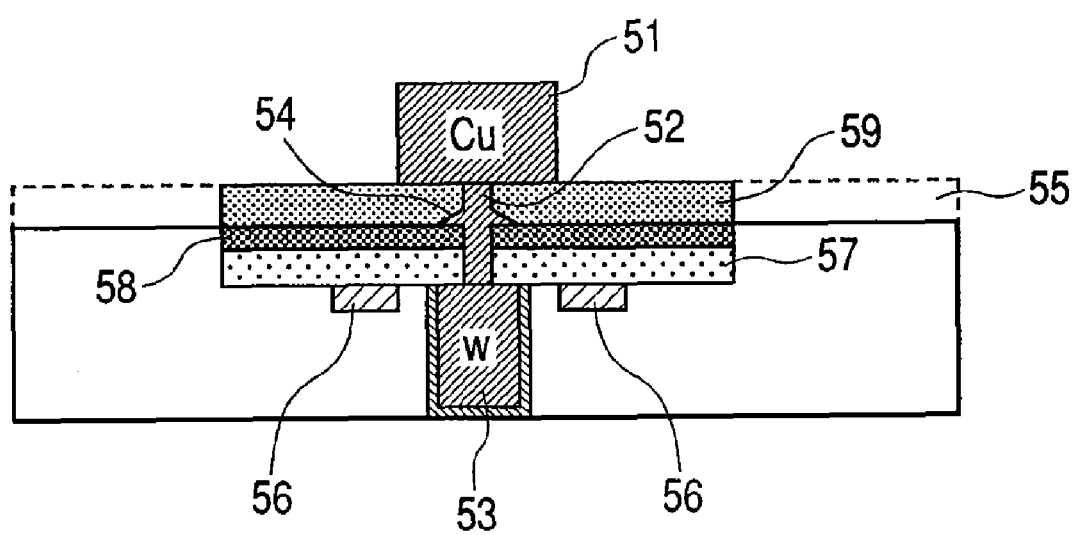
FIG. 3 is a cross sectional view of a memory cell to be turned on/off with the same direction voltage in the semiconductor device of the present invention.

A concrete structure for achieving the above object is shown in FIG. 3. The X-axis direction electrodes 56 are disposed so as to pass near the conductive path side end of one of the two electrodes disposed at both sides of the conductive path 52, for example, the lower electrode 53. At this time, more preferably, the range from the upper end to the lower end of the X-axis direction electrode 56 in the Z-axis direction should be almost aligned to the conductive path side end of one of the electrodes disposed at both sides of the conductive path 52 or almost on the same level (the Z-axis coordinates are almost the same between them). And it is still more preferable if the X-axis direction electrodes 56 pass both sides of the conductive path in the Y-axis direction around the conductive path side end of one of the electrodes disposed at both sides of the conductive path. The electrodes in the X-axis direction may be united into one after passing both sides of the conductive path around the conductive side end of one of the electrodes disposed at both sides of the conductive path 52. They may also be kept separated as are.

When in rewriting, if a voltage or high current short pulses are applied to the conductive pulse 52 even in a direction in which Cu ions supplied from the Cu electrode move downward, a heat is generated in the path 52 and around the path 52, thereby the conductive path 52 can be turned off due to the heat diffusion. In this case, however, if the resistance is raised and lowered many times repetitively, the Cu concentration around the conductive path formed region increases gradually, thereby it becomes difficult to turn off the conductive path 52. To avoid this problem, a voltage is applied to either the X-axis direction electrode or Y-axis direction electrode or to the electrodes in both directions at a proper timing to return the CU ions toward the Cu electrode, thereby keeping the constant state of the Cu concentration. Even in case of the voltage application for correct forming of the accumulating portion and passing the conductive path through the hole of the Y-axis direction electrode as described above, if a potential higher than that of the Cu electrode is applied to the object, Cu ions are returned effectively to the Cu electrode. At this time, it is also effective to apply a slightly high voltage to the object to return the ions to the Cu electrode between a write operation and the next write operation. There is another effective method to apply a voltage to many electrodes in the X-axis direction simultaneously to make it efficiently between writings to or between readings from memory cells, although it is possible to select one electrode at a predetermined Y-axis coordinate point in the X-axis direction to make such voltage application.

In other words, the same voltage may be applied to all the X-axis direction electrodes or all the Y-axis direction electrodes or all the electrodes in both X-axis and Y-axis directions in one device. Consequently, address specification is not required in this case. If the average of data values written in memory elements formed as a X-Y in-plane matrix is one-sided due to the long-time averaging, for example, if "1" is often set in a specific element and "0" is often set in another specific element upon writing binary data, a difference is generated between amounts of conductive ions (Cu ions) around those specific elements. In order to avoid this problem, preferably original data should be converted to a DC component free data string before it is written or consideration should be taken to the address specification for writing. It is also possible to improve the effect for controlling the amount of Cu ions by widening the horizontal width of each electrode in the X-axis direction to cover almost all the regions except for that through which the ion conductive path passes. It is also possible to unite some or all of the electrodes in the X-axis direction into one or unite some or all of the electrodes in the Y-axis direction into one. It is also possible to provide each Y-axis direction electrode with a cubic upward rising portion so as to surround each Cu electrode.

As described above, if a voltage polarity can be fixed to one direction to apply a voltage between an ion supply electrode and its counterpart electrode, diodes can be disposed at the point of X-Y intersection of the subject X-Y matrix respectively instead of transistors; the semiconductor device can thus have significant advantages in both cost reduction and high integration. In this case, because one diode is disposed at each point of X-Y intersection instead of a selection transistor, no source line is required.

Controlling the ion distribution with use of the electrodes in the X-axis direction as described above can suppress effectively changes of slow ion distribution to be caused by repetitive rewriting even when those rewriting operations are repeated by applying a voltage to the objects in forward and backward directions alternately.

A size of the accumulating region can be related to an information item by discriminating between a case in which a voltage is applied to the object so as to easily form a region for accumulating a conductivity improving component and a case in which a high voltage is applied at a time so as not to form the region for accumulating the conductivity improving component according to the size or presence/absence of the accumulating region. In FIG. 1, the conductive path, passing the hole of each electrode in the X-axis direction, is extended downward. Consequently, if a voltage is applied to the object so as to make the potential of each electrode in the X-axis direction go to the plus side slightly from the ion conductive path when the ion conductive path, passing near an electrode in the X-axis direction, is extended downward, the conductive path avoids the X-axis direction electrode. Thus the extension of the conductive path from the lower end of the accumulating region can be controlled. When controlling the X-axis direction electrodes more precisely, the movement of ions can be braked to form the above-mentioned accumulating region even when there is only one solid electrolytic layer and even when there is no phase boundary layer while there are two solid electrolytic layers. And the electrodes in the X-axis direction are disposed at narrow intervals, so that it might be difficult for the conductive path to pass through the holes of those electrodes. In this case, the problem will be avoided and the conductive path can be passed surely if the holes are formed with a proper diameter, that is, within a range from ⅓ of the minimum size to 1.5 times or under the maximum size of the X-Y in-plane of the lower electrode.

In the figure, an electrode is also disposed in the Y-axis direction. With this presence of the electrode in the Y-axis direction, ions distribution can be controlled more accurately. And because the electrode in the Y-axis direction is almost aligned to the accumulating region or almost on the same plane thereof, if controlling is made to assume the same potential as that of the accumulating region for the Y-axis direction electrode or assume a higher potential within 1V, the spreading of the accumulating region in the Y-axis direction can be controlled and the accumulating region can be formed correctly in a desired size. If only one solid electrolytic layer is formed, if an attempt is made to brake the extension of the ion conductive path downward with use of an electrode in the X-axis direction, the ion conductive path might be extended downward by avoiding the electrode in the X-axis direction in any way of the Y-axis direction. Therefore, preferably a slightly higher potential should also be applied to the Y-axis direction electrode to suppress the path extension. Each X-axis direction electrode has a hole through which the ion conductive path passes as shown in the figure. However, the two X-axis direction electrodes may also pass both sides (right and left sides) of the ion conductive path oriented in the Z-axis direction respectively just like the Y-axis direction electrode. Furthermore, the X-axis direction electrodes and the Y-axis and Y-axis direction electrodes may be aligned to each other almost on the same level in the Z-axis direction except around the ion conductive path.

Although Cu electrodes are employed in this embodiment, the Cu may be replaced with a metal composed of at least one element selected from a group consisting of Ag, Zn, Cd, and Al and to be diffused in solid electrolyte. If Ag is used to form electrodes, preferably Ag chalcogenide should be used instead of Cu chalcogenide in each solid electrolytic layer. A pure metal may not be necessarily used for electrodes. For example, oxide and chalcogenide having such a composition as $Cu_{30}Ta_{20}C_{50}$ may be used for electrodes. In this case, a metal electrode made of Ta, W, or the like should preferably be disposed at the opposite side of the solid electrolytic layer of the electrode. Furthermore, Cu and Ag should not be used to form the counterpart electrode. Au should also be avoided if possible. Favorable components usable for those electrodes are such metals as W, Ta, Mo, Nb, Cr, Ni, Co, Ti, and Pt group elements, that are not diffused so easily in the chalcogenide material or such compounds as Ti nitride, which is high in conductivity and not diffused easily.

(X-Y Matrix Driving)

In case of the voltage application as described above, the voltage may be applied to all the electrodes in the X-axis direction or in the Y-axis direction. However, it is more effective to apply the voltage only to the electrodes in the X-axis direction, which are passing near a memory cell in which writing is made, and to the electrodes in the Y-axis direction.

In this case, preferably the same address data as that of the memory cell addresses should be used for simultaneous address specification.

Finally, the conductive path reaches the other electrode formed with such a highly stable metal as W, Pt, or the like. Each of the Y-axis and X-axis direction electrodes is effective even when an information signal is related to whether or not the accumulating region exists, to the size of the accumulating region, to the thickness of the conductive path, or whether or not the path reaches the other electrode.

It is also preferable here to control the resistance of the conductive path with a combination of the OFF pulse and the ON pulse. Next, there will be described some examples of a circuit that uses a selection transistor for a case in which a backward voltage is used for rewriting and for a case in which a forward voltage is used for rewriting respectively.

(Backward Voltage)

Figure 4:
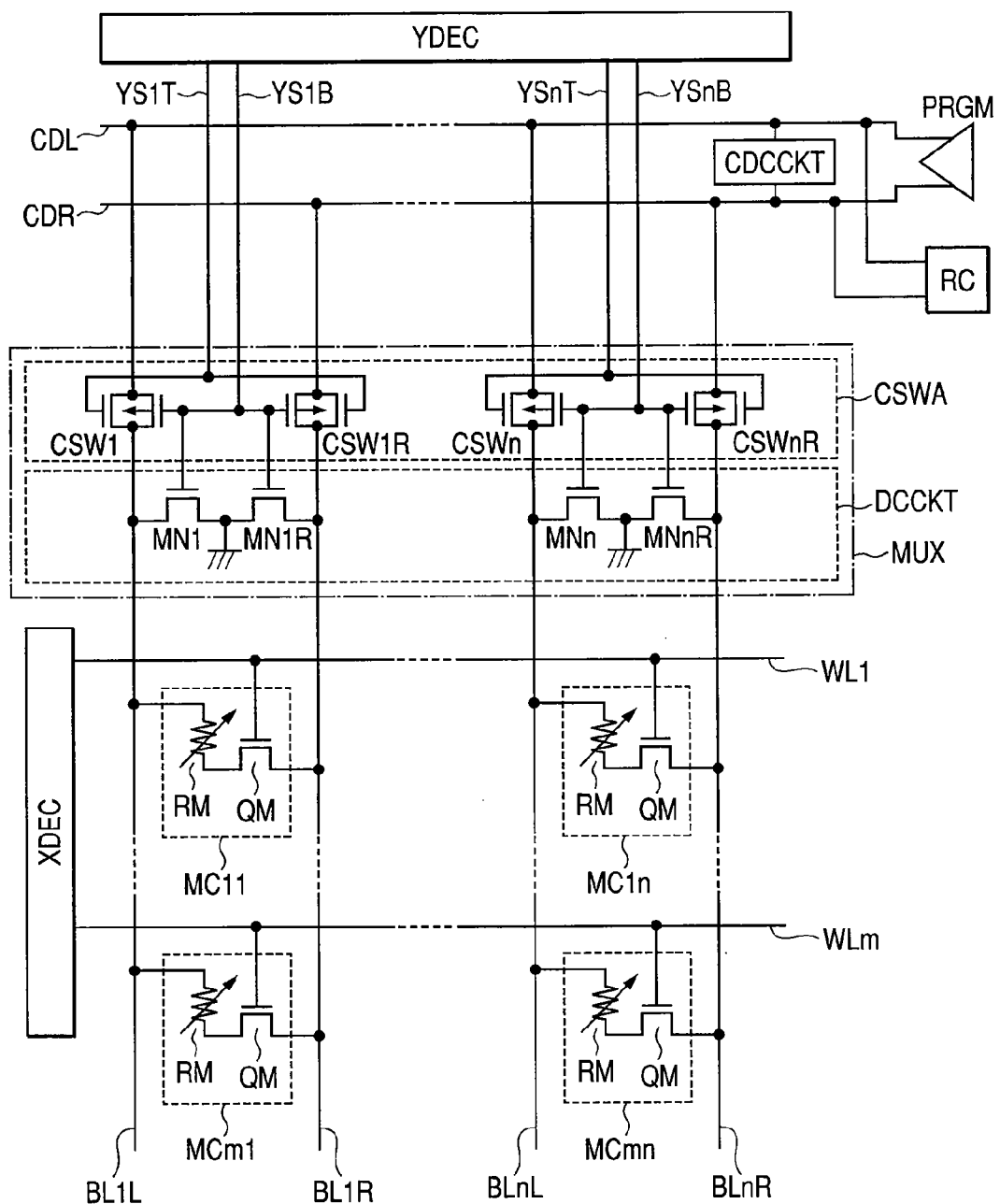
FIG. 4 is a configuration of a memory array in a semiconductor device in an embodiment of the present invention.

At first, there will be described an example of the configuration and operation of the semiconductor device with reference to FIGS. 4 through 6 in this first embodiment. The semiconductor device in this first embodiment includes a circuit that applies a voltage between a pair of electrodes, one positioned above and the other positioned below the conductive path shown in FIG. 1. FIG. 4 shows a circuit diagram of the circuit, which takes a memory array configuration consisting of n×m-bit memory cells. Each memory cell consists of elements that are a memory cell transistor QM and a memory element RM. This embodiment is characterized in that two bit lines are used and a memory cell is disposed at each point of intersection of a bit line and a ward line, thereby enabling a backward voltage to be applied to each memory element. Hereunder, there will be described the configuration of the semiconductor device shown in FIG. 4.

The semiconductor device shown in FIG. 4 includes a memory array, a multiplexer MUX, a row decoder XDEC, a column decoder YDEC, a read circuit RC, a rewrite circuit PRGM, and a common discharge circuit CDCCKT. The memory array consists of memory cells MC11 to MCmn disposed at points of intersection of word lines WL1 to WLm and bit line pairs (BL1L, BL1R) to (BLnL, BLnR) respectively. Each memory cell consists of a memory element RM and a selection transistor QM connected serially and inserted between one of the bit lines BL1L to LBnL and one of the bit lines BL1R to BLnR. The memory element RM is configured as shown in FIG. 4; an upper electrode 53 shown in FIG. 4 is connected to one of the bit lines BL1L to BLnL and a lower electrode TP shown in FIG. 4 is connected to one end of the memory cell transistor QM.

The read circuit RC, the rewrite circuit PRGM, and the common discharge circuit CDCCKT are connected to the common data line pair (CDL, CDR) respectively. The column selection switch array CSWA and the discharge circuit DCCKT are provided additionally with an element corresponding to the bit lines BL1R to BLnR respectively. This means that the column selection switch array CSWA is provided with a CMOS transmission gates (column selection switches) CSW1R to CSWnR inserted respectively between one of the bit lines BL1R to BLnR and the common data line CDR. The gate electrodes of the CMOS transmission gates CSW1 to CSWn, as well as CSW1R to CSWnR are connected to the column selection line pairs (YS1T, YS1B) to (YSnT, YSnB) respectively. If any one of the column selection line pairs (YS1T, YS1B) to (YSnT, YSnB) is activated, its corresponding pair of CMOS transmission gates are also activated, thereby one of the bit line pairs (BL1L, BL1R) to (BLnL, BLnR) is connected to the common data line pair (CDL, CDR).

The discharge circuit DCCKT is additionally provided with NMOS transistors MN1R to MNnR inserted between one of the bit lines BL1R to BLnR and the ground voltage VSS respectively. The gate electrodes of the NMOS transistors MN1R to MNnR are connected to the column selection lines YS1B to YSnB respectively. In the standby state, the column selection lines YS1B to YSnB are held at the supply voltage VDD, thereby the NMOS transistors MN1L to MNnL and MN1R to MNnR are turned on and the bit line pairs (BL1L, BL1R) to (BLnL, BLnR) are driven to the ground voltage VSS respectively.

Figure 5:
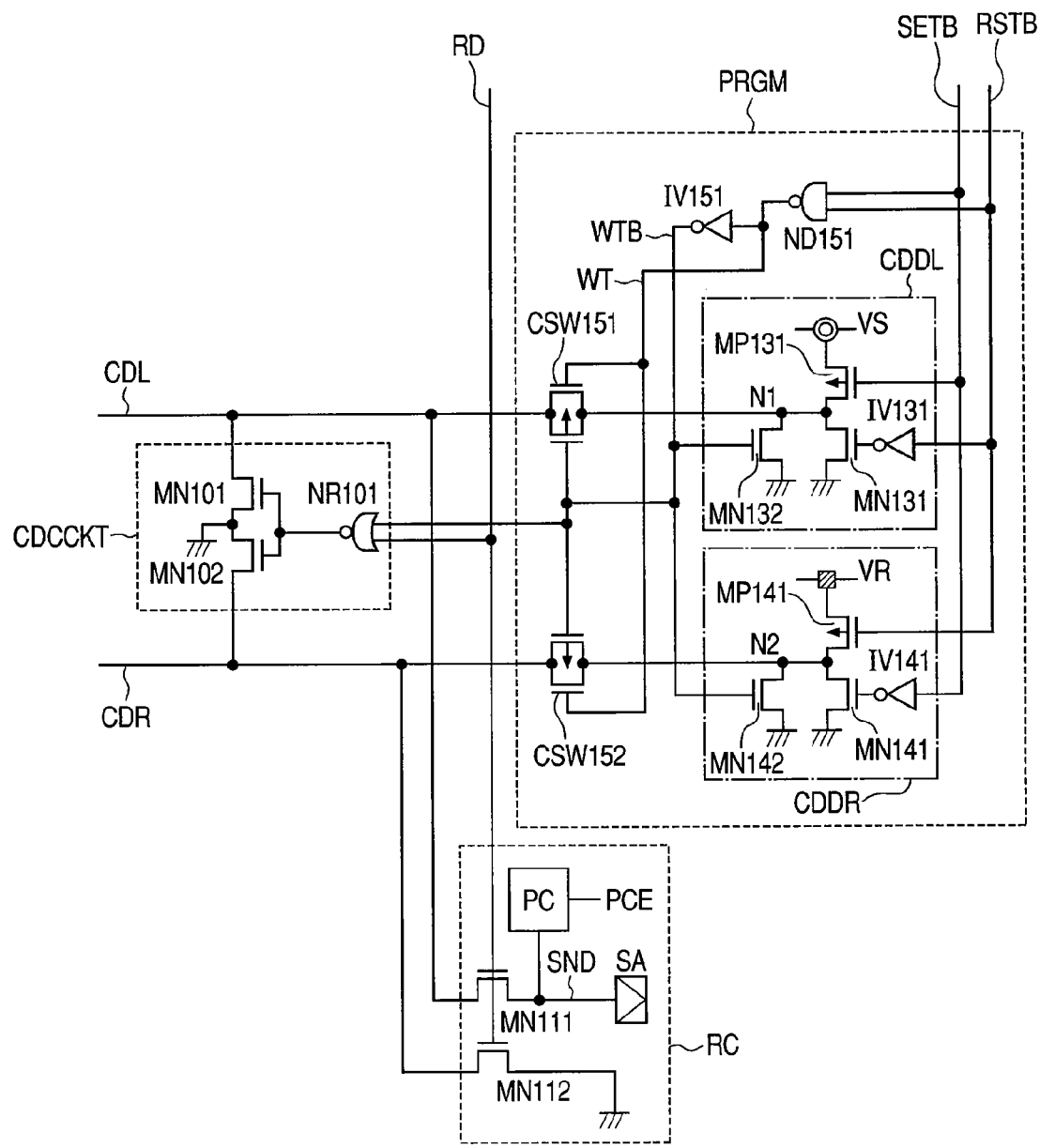
FIG. 5 is a circuit diagram of some circuits as a detailed example of the configuration of the semiconductor device shown in FIG. 4.

FIG. 5 is a detailed circuit diagram of the common discharge circuit CDCCKT, the read circuit RC, and the rewrite circuit PRGM shown in FIG. 4 respectively. The common discharge circuit CDCCKT consists of NM transistors MN101 and MN102, as well as an NOR circuit NR101. The MN101 is inserted between the common data line CDL and the ground voltage VSS and the MN102 is inserted between the common data line CDR and the ground voltage VSS. Each gate electrode is connected to an output terminal of the NOR circuit 101.

The input terminal of this NOR circuit NR101 inputs a read start signal RD and a rewrite start signal WT to be described layer respectively. In the standby state, those signals are held at the ground voltage VSS, so that the transistors MN101 and MN102 are turned on respectively. As a result, the common data line pair (CDL, CDR) are driven to the ground voltage VSS. On the other hand, when in reading, the read start signal RD is driven to the supply voltage VDD and when in rewriting, the rewrite start signal WT is driven to the supply voltage VDD. Thus the transistors MN101 and MN102 are turned off in those operations.

The read circuit RC consists of NMOS transistors MN111 and MN112, a pre-charge circuit PC, and a sense amplifier SA. The pre-charge circuit PC is connected to the sense amplifier SA at a node SND. The pre-charge circuit PC is activated with a high level (supply voltage VDD here) pre-charge start signal PCE to drive the node SND, etc. to the read voltage VRD. The transistor MN111 is inserted between the common data line CDL and the sense amplifier SA and the transistor MN112 is inserted between the common data line CDR and the ground voltage VSS. The gate electrodes of those transistors input the read start signal RD respectively.

This read start signal RD is held at the ground voltage VSS in the standby state as described above, so that the transistors MN111 and MN112 are turned off respectively in this case. On the other hand, when in reading, the read start signal RD held at the ground voltage VSS is driven to the supply voltage VDD, thereby the transistors MN111 and MN112 are turned on and the common data line CDL is connected to the pre-charge circuit PC and the sense amplifier SA respectively. And furthermore, the common data line CDR is connected to the ground voltage VSS. Because the configuration is as described above, when in reading, the common data line CDR drives the source electrode of the transistor QM in the selected memory cell through any one of the bit lines BL1R to BLnR. And the read signal corresponding to the object recorded information is inputted to the sense amplifier SA through the common data line CDL from the bit lines BK1L to BLnL, thereby the subject read operation is enabled just like in FIG. 8.

The rewrite circuit PRGM consists of common data line driving circuits CDDL and CDDR, CMOS transmission gates CSW151 and CSW152, a NAND circuit ND151, and an inverter circuit IV151. The CSW151 is inserted between the common data line CDL and the common data line driving circuit CDDL and the CSW152 is inserted between the common data line CDL and the common data line driving circuit CDDR. Those gate electrodes are connected to rewrite start signals WT and WTB that are obtained by carrying out an AND operation for both a set start signal SETB and a reset start signal RSTB with use of the NAND circuit ND151 and the inverter circuit IV151.

The set (for lowering the resistance) start signal SETB and the reset start signal RSTB are held at the supply voltage VDD in the standby state. Thus if the rewrite start signal WT is held at the ground voltage VSS and if the rewrite start signal WTB is held at the supply voltage VDD respectively, the common data lines CDL and CDR, as well as the common data line driving circuits CDDL and CDDR are shut down. On the other hand, when in a rewriting operation, the set start signal SETB or reset start signal RSTB is driven to the ground voltage VSS, so that the WT is driven to the supply voltage VDD and the WTB is driven to the ground voltage VDD respectively, thereby the CSW151 and the CSW152 are turned on respectively. As a result, the common data lines CDL and CDR are connected to the common data line driving circuits CDDL and CDDR respectively.

The common data line driving circuit CDDL consists of a PMOS transistor MP131, NMOS transistors MN131 and MN132, and an inverter circuit IV131. The transistors MP131 and NMOS transistor MN131 are inserted between the set voltage VS and the ground voltage VSS and the drain electrode of each of those transistors is assumed as a node N1. This node N1 is connected to the transmission gate CSW151 and the transistor MN132 is inserted between the node N1 and the ground voltage VSS.

The gate electrode of the transistor MP131 is connected to the set start signal SETB. When in a setting operation, the set start signal SETB held at the supply voltage VDD is driven to the ground voltage VSS and the transistor MP131 is turned on, thereby the set voltage VS is applied to the common data line CDL through the transmission gate CSW151. The gate electrode of the transistor MN131 is connected to a signal obtained by inverting the reset start signal RSTB in the inverter circuit IV131. When in a reset operation, the reset start signal RSTB held at the supply voltage VDD is driven to the ground voltage VSS. Then, the transistor MN131 is turned on, thereby the ground voltage VSS is applied to the common data line CDL through the transmission gate CSW151. The gate electrode of the transistor MN132 is connected to the rewrite start signal WTB. This rewrite start signal WTB is held at the supply voltage VDD in the standby state, so that the ground voltage VSS is applied to the node N1 when the transistor MN132 is turned on.

The common data line driving circuit CDDR consists of a PMOS transistor MP141, NMOS transistors MN141 and MN142, and an inverter circuit IV141. The transistors MP141 and NMOS transistor MN141 are inserted between the reset voltage VR and the ground voltage VSS and the drain electrode of each of those transistors is assumed as a node N2. This node N2 is connected to the transmission gate CSW152 and the transistor MN142 is inserted between the node N2 and the ground voltage VSS.

The gate electrode of the transistor MP141 is connected to the reset start signal RSTB. When in a reset operation, the reset start signal RSTB held at the supply voltage VDD is driven to the ground voltage VSS. Then, the transistor MP141 is turned on, thereby the reset voltage VR is applied to the common data line CDR through the transmission gate CSW152. The gate electrode of the transistor MN141 is connected to a signal obtained by inverting the set start signal SETB in the inverter circuit IV141. When in a set operation, the set start signal SETB held at the supply voltage VDD is driven to the ground voltage VSS. Then, the transistor MN141 is turned on, thereby the ground voltage VSS is applied to the common data line CDR through the transmission gate CSW152. The gate electrode of the transistor MN142 is connected to the rewrite start signal WTB. This rewrite start signal WTB is held at the supply voltage VDD in the standby state, so that the ground voltage VSS is applied to the node N2 when the transistor MN142 is turned on.

Figure 6:
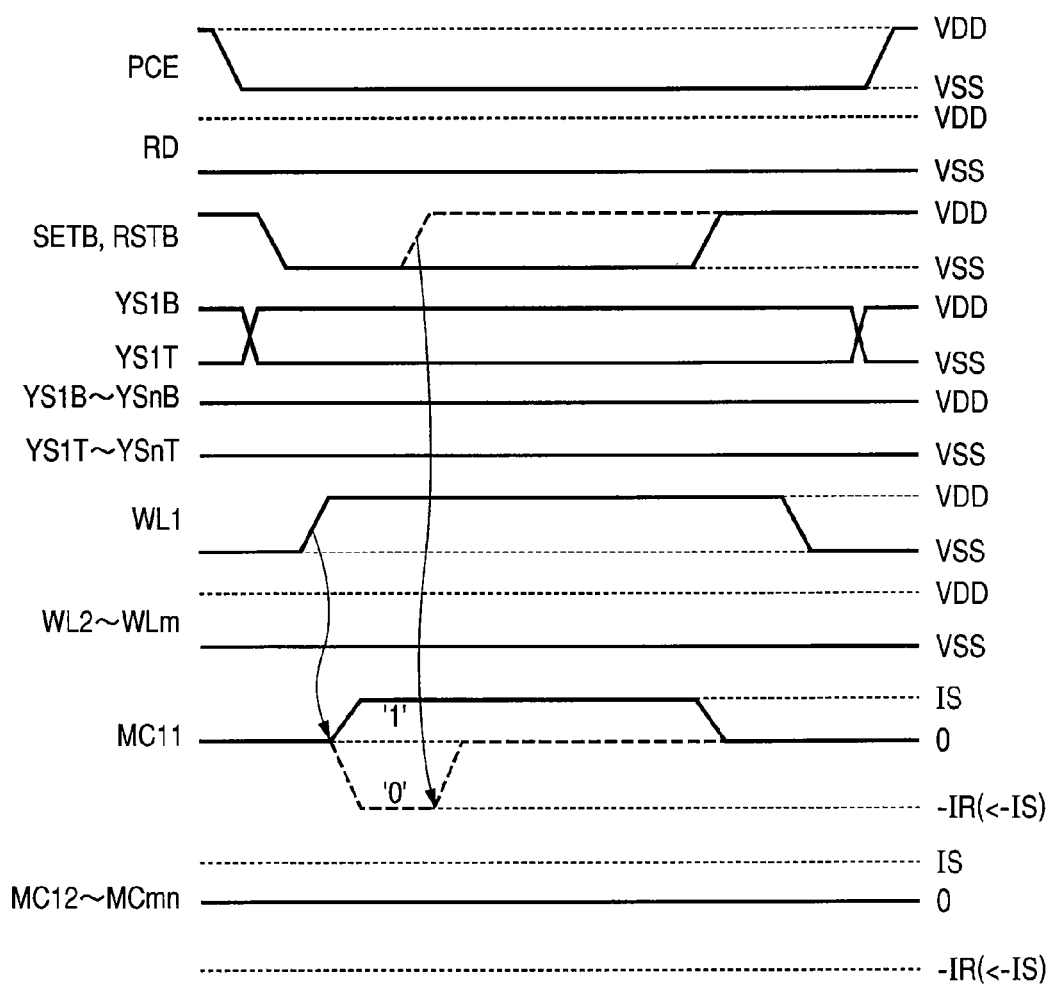
FIG. 6 is an example of a timing diagram with respect to a write operation of the memory array shown in FIG. 4.

FIG. 6 shows a waveform as an example of a rewrite operation carried out with use of the rewrite circuit PRGM. As shown in FIG. 6, when in a rewrite operation, a current can be applied to an object selected memory cell in the direction in accordance with the subject recorded information. This means that when in a set operation for writing recorded information "1" in a memory cell, the set (for writing recorded information) start signal SETB held at the supply voltage VDD is driven to the ground voltage VSS, thereby the transistors MP131 and MN141 are turned on. In the selected memory cell, therefore, the current can be flown from the memory element RM in the direction in accordance with the orientation of the transistor QM. On the contrary, when in a reset operation for writing recorded information '0' in a memory cell, the reset start signal RSTB held at the supply voltage VDD is driven to the ground voltage VSS. Thus the transistors MP141 and MN131 are turned on. As a result, in the selected memory cell, the current can be flown from the transistor QM in the direction in accordance with the orientation of the memory element RM.

At this time, the memory element RM functions as a source electrode. This is why consideration should be taken to the falling of memory cell transistor substrate bias and the reset voltage VR should be designed higher than the set voltage VS, so that the reset current absolute value becomes larger than the set current while the reset voltage VR is set equally to or lower than the supply voltage VDD. When in a reset operation like that, the reset current (−IR) is flown in the selected memory cell MC11 even in a short period similarly to the case shown in FIG. 9. The direction of the reset current (−IR) is inverted from that of the set current (IS). The reset current absolute value (|−IR|) is larger than the set current (IS) value.

Consequently, this first embodiment of the present invention can realize a semiconductor device that assures both high integration and stable data recording characteristics by configuring the device as shown in FIGS. 4 and 5 with use of the memory element RM as described above.

Concretely, when in a set operation, for example, a high voltage is applied to the bit line BLLL and a low voltage is applied to the BL1R, so that an electric field is generated in a direction from the upper electrode 53 to the lower electrode TP of the memory element RM. Consequently, the Cu ions are discharged from the upper electrode to the lower electrode. On the contrary, when in a reset operation, for example, a high voltage is applied to the bit line BL1R and a low voltage is applied to the bit line BL1L, so that an electric field is generated in a direction from the lower electrode TP to the upper electrode 53. Consequently, the Cu ions are attracted toward the upper electrode 53. Thus the rewrite operation can be carried out.

While the specifications of the memory cell transistor are not specially limited in the above description, it is also possible to raise the gate voltage by using a thick gate oxide film transistor as the memory cell transistor. As described above, the configuration and operation of the memory cell transistor enables the memory element RM to generate a substrate bias effect, which can suppress the degradation of the driving performance of the memory cell transistor QM. The semiconductor device can thus flow a large reset current in a direction opposite from the conventional one, as well. Such a selection circuit is also prepared for the Y-axis and X-axis direction electrodes. The selection circuit can select the X-axis direction for the X-axis electrodes and two or more electrodes in the Z-axis direction collectively while the selection circuit can select the Y-axis direction for the X-axis electrodes and two or more electrodes in the Z-axis direction collectively.

(Same Direction Voltage)

Figure 7:
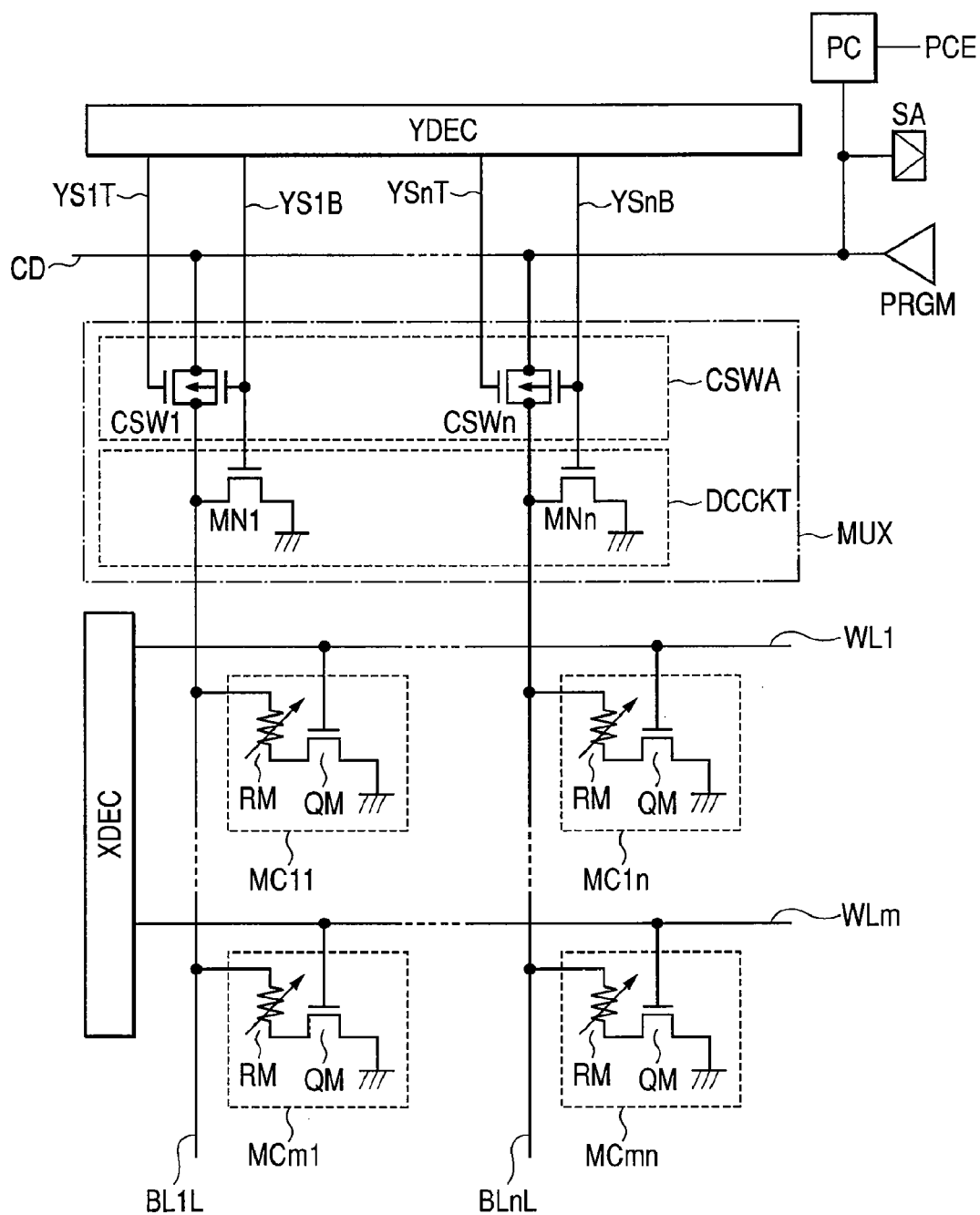
FIG. 7 is another example of configuration of the memory array in the semiconductor device in a fifth embodiment of the present invention.

FIG. 7 shows a circuit diagram of a memory array in the semiconductor device in another embodiment of the present invention. The memory array in this embodiment is configured with use of a recording layer made of a solid electrolytic material in the manufacturing processes as described above. The configuration is characterized in that a high voltage is applied to the upper electrode for operation. The semiconductor device shown in FIG. 6 consists of a memory array, a multiplexer MUX, a row decoder XDEC, a column decoder YDEC, a pre-charge circuit PC, a sense amplifier SA, and a rewrite circuit PRGM.

The memory array consists of memory cells MC11 to MC11*mn* disposed at points of intersection of word lines WL1 to WLm and bit lines BL1 to BLn respectively. In each memory cell, a memory element RM and a memory cell transistor QM that are connected serially are inserted between a bit line BL and a ground voltage VSS terminal and one end of the memory element RM is connected to the bit line BL. The memory cell RM has an upper electrode connected to the bit line (BL) and a lower electrode TP connected to one end of the memory cell transistor QM.

Each word line WL connected to an output signal of the row decoder XDEC is connected to the gate of the memory cell transistor QM. The pre-charge circuit PC, the sense amplifier SA, and the rewrite circuit PRGM are connected to the common data line CD respectively. The pre-charge circuit PC is activated by a high level (supply voltage VDD here) pre-charge start signal PCE to read the common data line CD and drive the line CD to the read voltage VRD (the voltage level will be described later).

The multiplexer MUX consists of a column switch array CSWA and a discharge circuit DCCKT. The column switch array CSWA consists of a plurality of CMOS transmission gates (column selection switches) CSW1 to CSWn inserted between the bit lines BL1 to BLn and the common data line CD respectively. The gate electrode of each of the CMOS transmission gates CSW1 to CSWn is connected to its corresponding one of the column selection line pairs (YS1T, YS1B) to (YSnT, YSnB), which are connected to output signals of the column decider YDEC respectively. If one of the column selection line pairs (YS1T, YS1B) to (YSnT, YSnB) is activated, its corresponding CMOS transmission gate is activated, thereby one of the bit lines BL1 to BLn is connected to the common data line CD.

The discharge circuit DCCKT consists of NMOS transistors MN1 to MNn inserted between the bit lines BL1 to BLn and the ground voltage VSS terminal respectively. The gate electrode of each of the NMOS transistors MN1 to MNn is connected to one of the column selection lines YS1B to YSnB. In the standby state, the column selection lines YS1B to YSnB are held at the supply voltage VDD, thereby the NMOS transistors MN1 to MNn are turned on and the bit lines BL1 to BLn are driven to the ground voltage VSS respectively.

Because of the configuration as described above, read operations are done as shown in FIG. 8. In the following descriptions, it is premised that the memory cell MC11 is selected. At first, the column selection switch CSW1 is turned on. The switch CSWL corresponds to the column selection line pair (YS1T, YS1B) selected by the column decoder YDEC. As a result, the bit line BL1 is connected to the common data line CD and the activated pre-charge circuit PC pre-charges the bit line BL1 up to the read voltage VRD through the common data line CD. This read voltage VRD is designed to have a voltage level between the supply voltage VDD and the ground voltage VSS so as not to cause damages in recorded information.

After that, the pre-charge start signal PCE held at the supply voltage VDD is driven to the ground voltage VSS so as to deactivate the pre-charge circuit PC. Furthermore, the memory cell transistor QM connected to the word line (WL1) selected by the row decoder XDEC is turned on, thereby a current path is formed in the memory cell MC11 and a read signal is generated in the bit line BL1 and the common data line CD respectively.

The resistance value in the selected memory cell differs between recorded information values, so that the voltage output to the common data line CD differs between recorded information values. In this case, if the recorded information value is '1', the resistance value in the memory cell is low and the bit line BL1 and the common data line CD are discharged to the ground voltage VSS, thereby the voltage becomes lower than the reference voltage VREF. On the other hand, if the recorded information value is '0', the resistance value in the memory cell is high and the bit line BL1 and the common data line CD are held in the pre-charge state, that is, at the read voltage. This difference is distinguished by the sense amplifier SA, thereby the recorded information in the selected memory cell is read out. Finally, the column selection line pair (YS1T, YS1B) is deactivated to turn on the transistor MN1, thereby the bit line BL1 is driven to the ground voltage VSS and the pre-charge start signal PCE held at the ground voltage VSS is driven to the supply voltage VDD to activate the pre-charge circuit PC. Thus the memory cell returns to the standby state.

Figure 9:
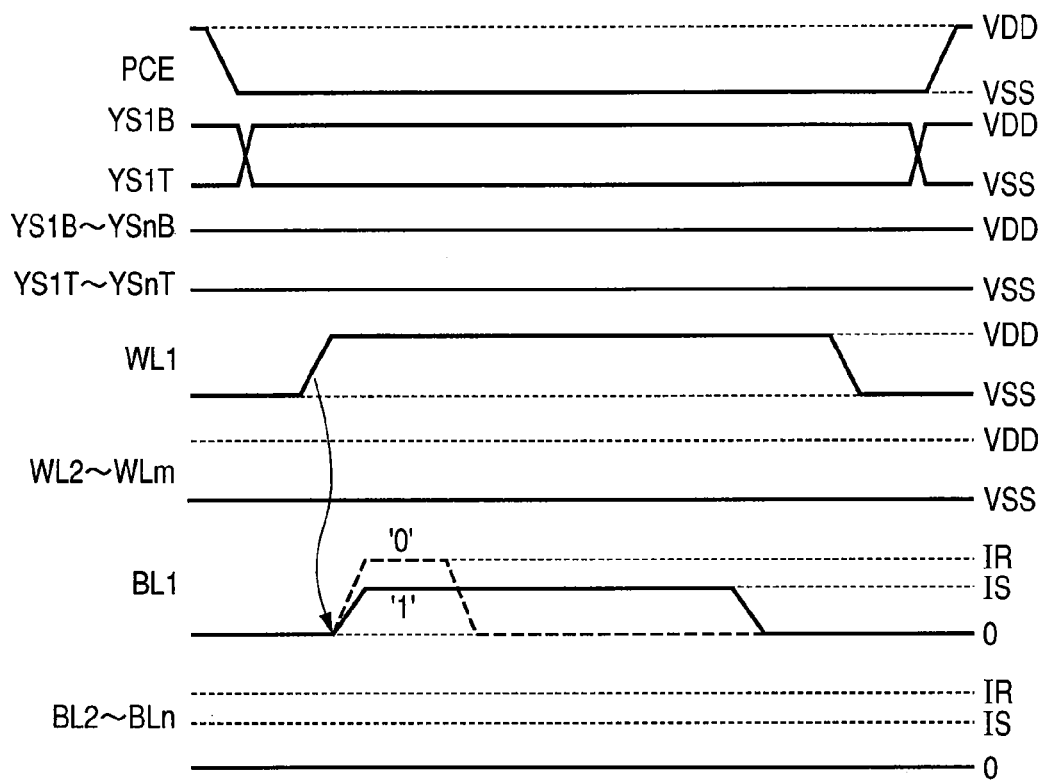
FIG. 9 is an example of a timing diagram with respect to a write operation of the memory array shown in FIG. 7.

FIG. 9 shows a timing diagram of a write operation carried out in the memory array shown in FIG. 7. Just like the example in FIG. 4, it is premised here that the memory cell MC11 is selected. At first, the pre-charge start signal PCE held at the supply voltage VDD is driven to the ground voltage VSS to deactivate the pre-charge circuit. Then, the column selection switch CSW1 corresponding to the column selection line pair (YS1T, YS1B) selected by the column decoder YDEC is turned on, thereby the bit line BL1 is connected to the write circuit PRGM through the common data line CD. After this, the memory cell transistor QM connected to the word line (WL1) selected by the row decoder XDEC is turned on, thereby a current path is formed in the memory cell MC11 and a write current flows into the bit line BL1.

The write circuit PRGM is designed so that the write current and its applying time have values in accordance with the object recorded information. Here, if the recorded information value is '0', it is premised that a large reset (to raise the resistance) current IR is applied to the memory cell for a short time. On the other hand, if the recorded information value is '1', it is premised that a set current IS smaller than the reset current IR is applied to the memory cell for a longer time than the reset current IR. Finally, the column selection line pair (YS1T, YS1B) is deactivated to turn on the transistor MN1, thereby the bit line BL1 is driven to the ground voltage VSS and the pre-charge start signal PCE held at the ground voltage VSS is driven to the supply voltage VDD to activate the pre-charge circuit PC. Thus the memory cell MC11 returns to the standby state.

(Lower Structure Forming Process)

Figure 13:
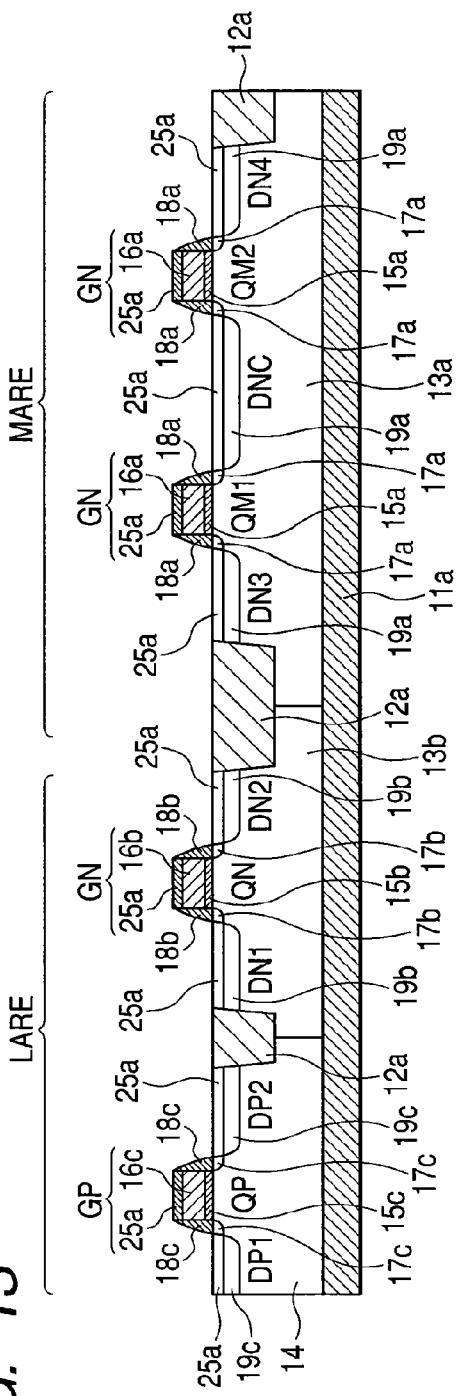
FIG. 13 is an explanatory cross sectional view of a configuration of a major portion of the semiconductor device in the first embodiment of the present invention in its manufacturing process.

Next, there will be described some processes required just before the process for forming the solid electrolytic layer with reference to the accompanying drawings. Those processes are included in the manufacturing processes of the semiconductor device in this embodiment. FIGS. 13 through 17 are cross sectional views of the major portion of the semiconductor device in this embodiment. At first, a MIS transistor is formed with use of a known manufacturing method. In FIG. 13, an element isolation region 12a made of an insulation material is formed on a main surface of a semiconductor substrate (semiconductor wafer) 11 made of, for example, p-type single crystal silicon or the like with use of, for example, the STI (Shallow Trench Isolation) method, LOCOS (Local Oxidization of Silicon) method, or the like. After the forming of the element isolation region 12a, on the main surface of the semiconductor substrate 11 is formed an activation region of which circumference is limited by the element isolation region 12a.

On the main surface of the semiconductor substrate 11a is formed p-type wells 13b and 13c, as well as an –n-type well 14a. The p-type well 13c is formed in a memory cell region MARE and the p-type well 13b and the n-type well 14a are formed in a logic circuit region LARE. Furthermore, on the surfaces of the p-type wells 13b and 13c, as well as on the surface of the n-type well 14a are deposited, for example, an insulation film 15a used for gate insulation, which consists of a thin silicon oxide film, a silicon oxynitride film, etc. with use of, for example, a thermal oxidization method or the like. The insulation film 15a may be about 1.5 to 10 nm in thickness. On the insulation film 15a are formed gate electrodes 16a, 16b, and 16c made of a low resistance polycrystal silicon film or the like. Impurities are then doped in the insulation film 51a before or after the film deposition to make the gate electrodes 16a and 16b n-type impurity doped polycrystal silicon film and the gate electrode 16c p-type impurity doped polycrystal silicon film.

Furthermore, an n– type semiconductor region 17a is formed in a process of ion-implanting of n-type impurities in the regions at both sides of the gate electrode 16a of the p-type well 13b and an n– type semiconductor region 17b is formed in a process of ion-implanting of n-type impurities in the regions at both sides of the gate electrode 16b of the p-type well 13c. Furthermore, an p– type semiconductor region 17c is formed in a process of ion-implanting of p-type impurities in the regions at both sides of the gate electrode 16c of the n-type well 14. And at the sides of the gate electrodes 16a, 16b, and 16c are formed side walls 18a, 18b, and 18c respectively by, for example, depositing an insulation film consisting of a silicon oxide film, a silicon nitride film or a multilayered film of those films on the semiconductor substrate 11, then carrying out anisotropic etching for this insulating film.

Furthermore, an n+ type semiconductor region 19a is formed in the regions at both sides of the gate electrode 16a of the p-type well 13c and the side wall 18a of the gate electrode 16a respectively and an n+ type semiconductor region 19b is formed in the regions at both sides of the gate electrode 16b of the p-type well 13b and the side wall 18b of the gate electrode 16b in a process of ion-implanting of n-type impurities respectively. And a p+ type semiconductor region 19c is formed in the regions at both sides of the gate electrode 16c of the n-type well 14 and the side wall 18c of the gate electrode 16c respectively in a process of ion-implanting of p-type impurities. Then, the surfaces of the gate electrodes 16a, 16b, and 16c, the n+ type semiconductor regions 19a and 19b, as well as the p+ type semiconductor region 19c are exposed and such a metal film as a cobalt (Co) film is deposited thereon, then subjected to a thermal process, thereby a metal silicide layer 25 is deposited on each of those surfaces. The structure shown in FIG. 13 is thus obtained.

Figure 14:
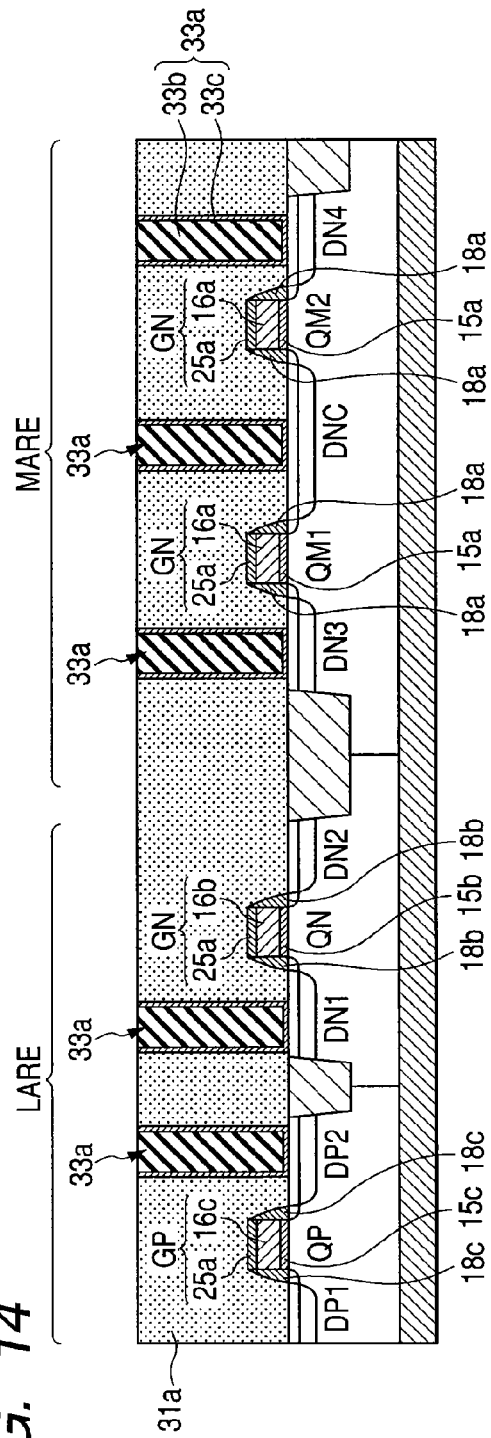
FIG. 14 is another explanatory cross sectional view of a configuration of a major portion of the semiconductor device in the first embodiment of the present invention in its manufacturing process.

After this, an insulation film (interlayer insulation film) 31a is deposited so as to cover the gate electrodes 16a, 16b, and 16c on the semiconductor substrate 11 as shown in FIG. 14. The insulation film 31a consists of, for example, a silicon oxide film, etc. The insulation film 31a can also be formed with a multilayer film consisting of a plurality of insulation films. After the depositing the insulation film 31a, the top surface of the film 31a is flattened with a CMP process as needed. Then, dry-etching is carried out for the insulation film 31a using the photo-resist pattern (not shown) formed on the insulation film 31a as an etching mask with use of the photolithography method, thereby forming a contact hole in the insulation film 31a. At the bottom of the contact hole are exposed part of the main surface of the semiconductor substrate 11a, for example, part of the semiconductor regions DN1 to DN4, DNC, DP1, and DP2 (their metal silicide layers 25a), part of the gate electrodes 16a, 16b, and 16c (their metal silicide layers 25a), etc.

After this, a plug 33a is formed in this contact hole. At this time, for example, a conductive barrier film is deposited on the insulation film 31a including the inside portion of the contact hole with a sputtering method or the like, then a tungsten film 33b is deposited on the conductive barrier film 33a with the CVD method or the like. Then, unnecessary portions of the tungsten film 33b and the conductive barrier film 33a are removed from the insulation film 31a with the CMP method, the etch-back method, or the like. Consequently, forming of the plug 33a is completed. The plug 33a thus comes to consist of the tungsten film 33b and the conductive barrier film 33c buried in the contact hole.

Figure 15:
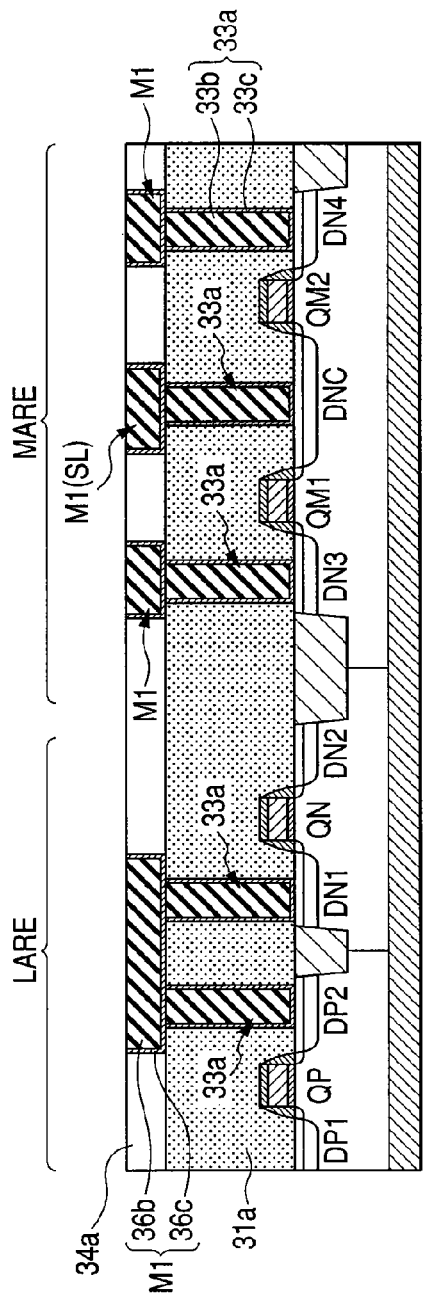
FIG. 15 is an explanatory cross sectional view of the semiconductor device in a manufacturing process following that shown in FIG. 14.

Then, as shown in FIG. 15, an insulation film 34a is deposited on the insulation film 31a in which the plug 33a is buried. After this, dry-etching is carried out for the insulation film 34a using the photo-resist pattern (not shown) as an etching mask to form a wiring groove in the insulation film 34. The photo-resist pattern is formed on the insulation film 34a with use of the photography method. At the bottom of this wiring groove is exposed the top face of the plug 33a. Of the wiring groove, the wiring groove 35a where the plug 33a is exposed can be formed as a hole pattern (contact hole) larger than the plane of the exposed plug 33a, not a groove-like pattern. As described above, the plug 33a is formed on the QM1 and QM2 drain regions (semiconductor regions DN3 and DN4) in the memory cell region MARE.

Then, a wiring M1 is formed in this wiring groove. At this time, for example, a conductive barrier film 36a is deposited on the insulation film 34a that includes the inside portions (the surfaces of the bottom and side walls) of the wiring groove with the sputtering method or the like, then a main conductive film 36b consisting of a tungsten film, etc. is deposited on the conductive barrier film 36a with the CVD method or the like. After this, unnecessary portions of the main conductive film 36b and the conductive barrier film 36a are removed from the insulation film 34a with the etching-back method or the like. Consequently, forming of the wiring M1 is completed. The wiring M1 thus comes to consist of the main conductive film 36b and the conductive barrier film 36a buried in the wiring groove 35. The wiring M1 is not limited only to the buried tungsten wiring as described above; it may be varied freely. For example, a tungsten wiring and an aluminum wiring that are not buried may also be used as such a wiring.

Figure 16:
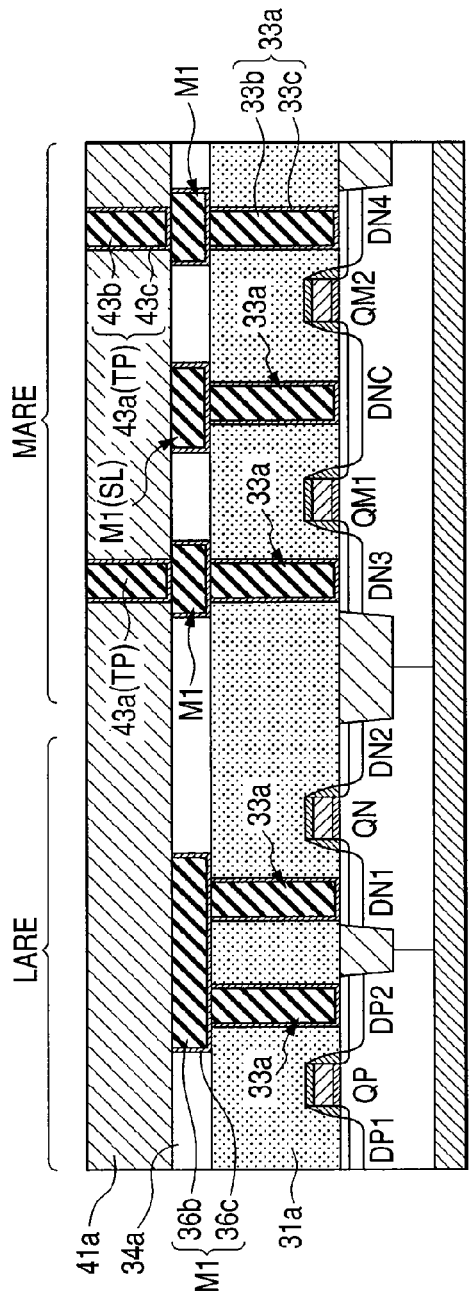
FIG. 16 is an explanatory cross sectional view of the semiconductor device in a manufacturing process following that shown in FIG. 15.

After this, as shown in FIG. 16, an insulation film (interlayer insulation film) 41a is deposited on the insulator 34a in which the wiring M1 is buried. Then, dry-etching is carried out for the insulator 41a using the photo-resist pattern (not shown) formed on the insulator 41a with the photolithography method as an etching mask, thereby forming a through-hole (opening, contact hole) in the insulator 41a. This through-hole is formed in the memory cell region MARE and at the bottom of the through-hole are exposed the top surface of the wiring M1 corresponding to the semiconductor regions DN3 and DN4 of the QM1 and QM2.

Then, a plug 43a is formed in the through-hole. At this time, for example, a conductive barrier film 43a is deposited on the insulator 41a that includes the inside portion of the through-hole with the sputtering method or the like, then a tungsten film 43b is formed thereon with the CVD method or the like. After this, unnecessary portions of the tungsten film 43b and the conductive barrier film 43c are removed from the insulator 41a with the CMP or etching-back method. Consequently, forming of the plug 43a is completed. The plug 43a thus comes to consists of the remaining portions of the tungsten film 43b and the conductive barrier film 43c buried in the contact hole respectively. In such a way, this plug 43a is formed by filling a conductive material in the opening (through-hole) formed in the insulator 41.

In this embodiment, although the tungsten film 43b is used to burry the remaining films in the through-hole to form the plug 43a, the tungsten film 43b may be replaced with a metal film (to be easily flattened with the CMP method) so as to flatten the top face of the plug 43a more accurately in the CMP process. For example, a molybdenum (Mo) film of which crystal particle size is small may be used instead of the tungsten film 43b. The Mo film is easily flattened with the CMP method. Such a metal that is easily flattened with the CMP process is effective to suppress local changes of the recording layer 52a to be caused by electric field concentration that might occur when the top face of the plug 43a is not even. As a result, the semiconductor device of the present invention can be improved more in electrical characteristics of the memory cell element and reliability for assuring many rewrite operations, as well as operation characteristics at high temperatures.

Figure 17:
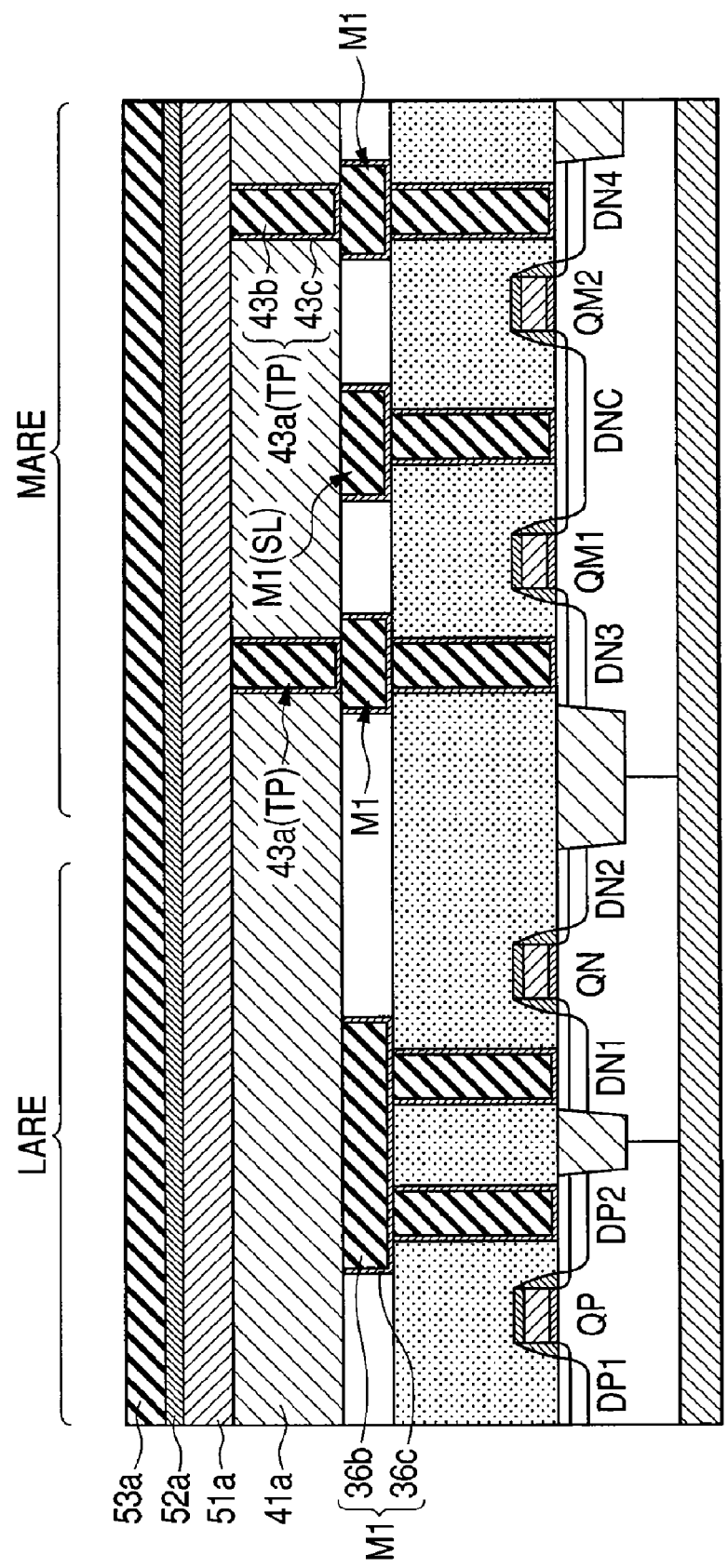
FIG. 17 is an explanatory cross sectional view of the semiconductor device in a manufacturing process following that shown in FIG. 16.

After this, as shown in FIG. 17, an oxide solid electrolytic layer 51a, a phase boundary layer 52a, and a solid electrolytic layer 53a are deposited in this order on the insulator 41 in which the plug 43a is buried. The oxide solid electrolytic layer 51a is, for example, 0.5 to 5 nm in thickness. The phase boundary layer 52a is, for example, 2 to 10 nm in thickness. And the solid electrolytic layer 53a is, for example, 50 to 200 nm in thickness. The electrodes in the X-axis and Y-axis directions are formed with use of photo-resist. The electrodes in the X-axis direction are aligned at their lower faces after the solid electrolytic layer 53a is deposited. The electrodes in the Y-axis direction are formed on the deposited solid electrolytic layer. Another solid electrolytic layer may also be deposited between each of the electrodes in the X-axis direction and the phase boundary layer deposited under that.

The non-metal element components of the solid electrolyte in each of the above layers are listed vertically in the periodic law table. They are listed up in the order of selenium, sulfur, and oxygen. Here, sulfur and oxygen that are selected as examples have compositions of Cu—Ta—O and Cu—Ta—S respectively.

The solid electrolytic layer is mad of a multilayer consisting of at least two or more layers having different compositions from each another. Concretely, the two or more layers include an oxide layer including at least one element selected from a group consisting of Cu, Ag, Zn, Cd, and Al, and/or at least one element selected from a group consisting of Ta, Mo, Nb, Cr, Ni, Co, Ti, and Pt group elements, and O, as well as a layer made of at least one element selected from a group consisting of Cu, Ag, Zn, Cd, and Al, and/or a group consisting of Ta, Mo, Nb, Cr, Ni, Co, Ti, and Pt group elements, and at least an element selected from a group consisting of O, S, Se, and Te.

As another example of the solid electrolytic layer, the layer may take any of the compositions of Cu—O and Ta—O.

On the top is formed an upper electrode with a 50 nm thick Cu layer through sputtering, as well as through etching that uses photo-resist. The upper electrode is formed just above its corresponding plug-like lower electrode or deviated from the lower electrode by a predetermined angle and in a predetermined direction. Then, a 1 nm thick tantalum oxide layer is deposited on the phase boundary between solid electrolytic layers.

(Writing Method)

Writing to a memory cell is made by applying a voltage between a selected pair of upper and lower electrodes, or by applying a voltage further to an electrode in the X-axis or Y-axis direction, which passes near the conductive path between the above pair of electrodes in addition to the voltage application. The voltage to be applied here is a voltage that moves a low resistance region forming component, that is, Cu plus ions downward or a voltage that slows down the downward movement of the Cu ions to spread them in a direction parallel to the plane of the laminated film. When spreading the Cu ions in the direction in such a way, it is recommended to utilize a phase boundary between solid electrolytic layers or a phase boundary layer having less thin gaps formed at the phase boundary.

When erasing written information from a memory cell, a backward voltage is applied to the object to collect the plus ions spread in a direction parallel to the plane toward the upper electrode.

If a plurality of upper and lower electrode pairs are selected so that the Y-axis or X-axis direction electrode that comes to pass near the conductive path is changed each time, it is possible to write information to a plurality of conductive paths simultaneously, thereby raising the write transfer rate.

The drive circuit in this embodiment is designed so as to invert the voltage polarity to lower or raise the resistance when driving the object. However, if a known phase change memory drive circuit is used here, inverting the voltage polarity can be omitted; the same polarity can be kept for the driving. In this case, the object conductive path is heated with high voltage short pulses to scatter ions around. This method reduces the possible number of rewrite operations accordingly.

When in writing, the number of pulses and the width of those pulses to be applied to each electrode around the object memory cell controls the movement of the component that improves the conductivity between each pair of upper and lower electrodes described above. Concretely, when recording information in a region formed so as to accumulate the conductivity improving component, a pulse voltage is applied as follows. A 3-volt 100 μs wide pulse voltage is applied between a selected pair of upper and lower electrodes; then a pulse voltage that is 0.1 to 2V lower than that of the upper voltage (e.g., 2V) and the same in width is applied to an object X-axis direction electrode passing just under the writing position almost synchronously with the above pulse application; then a pulse voltage is applied to an object X-axis direction electrode passing just above the writing position almost synchronously with the above pulse application, the pulse voltage being 0.1V to 1.5V lower than that of the upper electrode, and more than 0.1V lower relatively than that of the electrode passing just under the writing position (e.g., +2.5V). After this, a pulse voltage is applied to an object Y-axis electrode passing near both sides of the writing position, the voltage being 0.1V to 2V lower than that of the upper voltage; and a pulse voltage is applied to an object X-axis direction electrode passing just under the writing position, the voltage being the same or more than 1V lower relatively than that of the upper electrode (e.g., +1.5V). If there is no need to form a region for accumulating a conductivity improving component (e.g., corresponding to '0' of digital data), the voltage of the object X-axis direction electrode passing under the writing position is lowered. For example, a +0.5V is used so as to make it easy to pass plus ions. At this time, the voltage of the X-axis direction electrode that is further lower by one than the subject one should preferably be more lowered, for example, to 0.2V so as to attract ions.

(Multi-Value Multi-Bit Recording)

The voltages and/or pulse widths to be applied to those electrodes may be adjusted finely to control the size of the region for accumulating the conductivity improving component with use of multiple values. In this case, multi-byte recording can be made with, for example, multiple values within one byte.

Voltage application to Y-axis direction electrodes is not always required; the voltage application may be omitted and furthermore, the Y-axis direction electrodes themselves may be omitted.

Some of the metal elements contained in layers are common between at least adjacent two layers.

According to one aspect of the present invention, when in writing, the semiconductor device controls the resistance between each pair of upper and lower electrodes with an ON pulse voltage (while the upper Cu electrode functions as an anode).

According to another aspect of the present invention, the semiconductor device controls the resistance with a combination of an OFF pulse voltage and an ON pulse voltage to be applied in this order.

(Reading Method)

Because a voltage can be applied in three axis directions (X, Y, and Z), there are some possible reading methods.

(Resistance Value Detection)

There is one reading method closest to the conventional one. The method detects a resistance value by applying a voltage between an ion supply electrode and its counterpart electrode.

(Resistance Value Detection with Respect to X-Axis Electrodes)

When in reading, a voltage is applied between an electrode disposed at either one end of a corresponding high conductivity path and one Y-axis direction electrode passing at least near the corresponding high conductivity path, then the object recorded information is detected according to the resistance value detected as a result of the voltage application. If the region for accumulating the resistivity lowering component is in contact with the object Y-axis direction electrode or close to it, the situation is detected as such a resistance change. In this case, there are two cases; in one case, one electrode is provided in the Y-axis direction between two adjacent Z-axis direction conductive paths and in the other case, two electrodes are provided in the Y-axis direction. In case of the former case (when one electrode is provided), the integration degree is easily improved, but a top-shaped accumulating region in the middle of the conductive path might reach both of the upper and lower electrodes in the X-axis direction. To avoid this, therefore, it is required to specify and select the coordinates of each X-axis direction electrode in the Y-axis direction or put those X-axis electrodes in two groups alternately and select either of the two groups when in reading.

There is another reading method, which detects a voltage between a pair of electrodes in the X-axis direction while applying a voltage to the conductive path in the Z-axis direction. The pairs of the X-axis direction electrodes are selected one by one sequentially in the Z-axis direction to read positions (a plurality of positions) of the conductive path where the resistivity lowering component is accumulated respectively.

(Electromagnetic Inductance Voltage Detection)

There is still another reading method, which flows forward and backward pulse currents to a pair of X-axis direction electrodes passing both sides of a conductive path therebetween in the Z-axis direction from which object information is to be read, thereby reading an electromotive force caused by those paired X-axis direction electrodes. In this case, if a read current is flown to an electrode in the Y-axis direction, a magnetic field is generated in a direction in which the right-handed screw turns in accordance with the right-handed screw law teachings of Ampere. The strength of the magnetic field is calculated as follows according to the law of Biot-Sabert.

$$dH = (J \sin \theta \, ds)/4\pi r^2$$

The magnetic field is also generated in the same direction by the counterpart X-axis direction electrode to which a backward current is applied. And those magnetic fields function to generate an over-current in an ion accumulating region, thereby another magnetic field is generated in a direction vertical to the metal disc of the ion accumulating region. The over-current moves on the metal disc with a pulse current applied to the two electrodes in the X-axis direction at slightly different timings.

Figure 8:
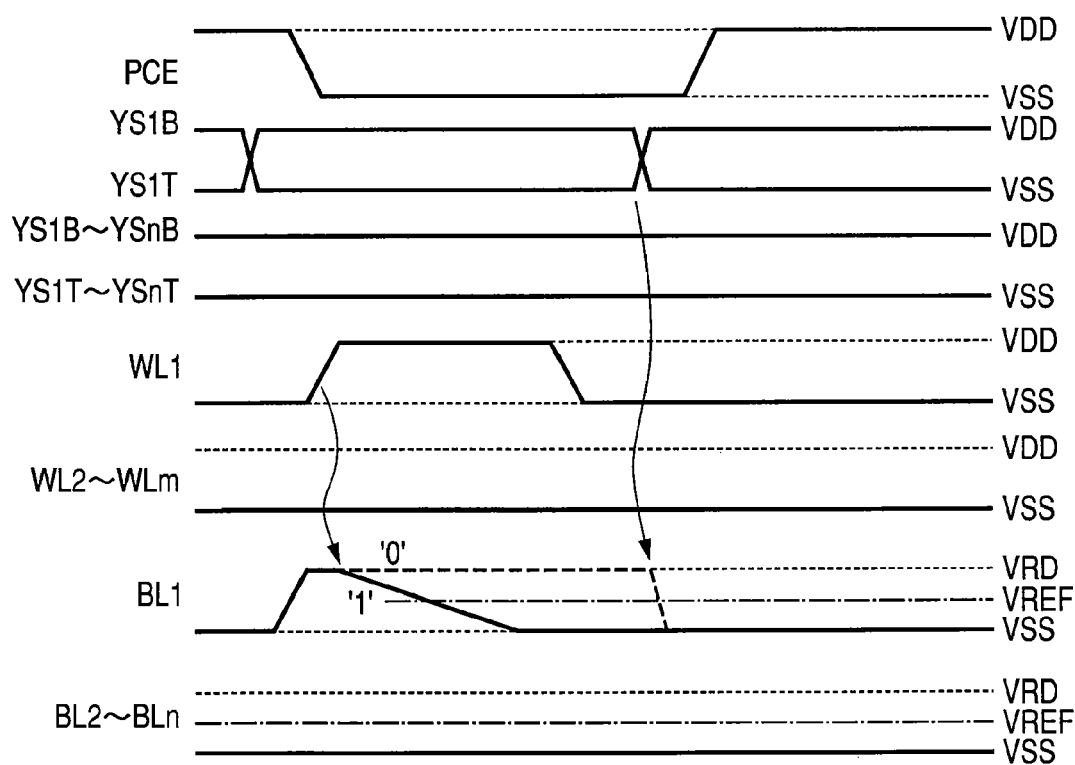
FIG. 8 is an example of a timing diagram with respect to a read operation of the memory array shown in FIG. 7.
Figure 18:
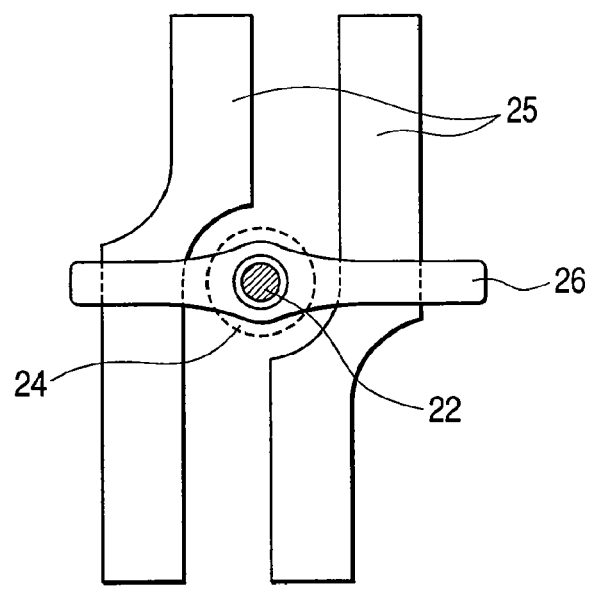
FIG. 18 is a cross sectional view of a shape of an X-axis direction electrode in the semiconductor device in the first embodiment of the present invention.

The stronger part of the over-current moves obliquely from lower right to upper left due to the shape of the Y-axis direction electrode shown in FIG. 18. Although only one Z-axis direction conductive path is shown in FIG. 8, there are actually many Z-axis direction conductive paths in the Y-axis direction within a close distance. In FIG. 18, both ends of the X-axis direction electrode is extended vertically to make it understood easily. In this case, the Y-axis direction electrode moves to the upper right from the bottom in FIG. 18, then returns to the upper left before passing near the next Z-axis direction electrode. If returning to the upper left in such a way, the Z-axis direction electrodes are disposed side by side just upward. If not, each of those Z-axis direction electrodes is shifted slightly to the upper right obliquely from the preceding one when in disposition. And because each X-axis direction electrode passes near the ion accumulating region, if the over-current moves obliquely, the magnetic flux in the magnetic field generated by the over-current comes to cross the X-axis direction electrode, thereby an electromotive force is generated there according to the principle of electric motors. If a Y-axis direction electrode and an X-axis direction electrode cross each other, the magnetic flux of the magnetic field generated by the X-axis direction electrode might move in the X-axis direction due to the difference between the timings of the pulse current flowing to the two Y-axis direction electrodes, but it does not cross the X-axis so often. Thus the electromotive force will not be generated so easily directly from the Y-axis direction current. Consequently, the electromagnetic force of the X-axis direction electrode can be used to know the presence/absence and size of accumulated ions. When it comes to the X-Y plane shown in FIG. 18, transistors or diodes are disposed at points of intersection in case of the ordinary matrix-like disposition of memory cells. In this embodiment, however, if the voltage of the Y-axis direction electrodes is kept free of the influences from other electrodes, there is almost no case in which the magnetic flux passes another cross point for a detour. Thus there is no need to use diodes and transistors.

As described above, the read transfer rate can be improved significantly by reading information simultaneously from a plurality of conductive paths close to the X-axis direction electrodes respectively with help of the Y-axis direction electrodes. And information of each Y-axis direction coordinate point can be read separately from others by slightly shifting the pulse voltage applied to the next Y-axis direction electrode from the preceding one sequentially when in reading. And in order to raise the transfer rate, the subject read signal from a nearer X-axis direction coordinate point is overlapped unavoidably with another. This problem is solved by encoding and recording the object information so as to obtain an almost constant electromotive force on the average in a predetermined short period. This can prevent read errors.

While the X-Y one-dimensional arrangement of memory cells has been described in this embodiment and diodes are disposed at points of the X-Y intersection instead of transistors to enable reading, this embodiment also includes another case in which a plurality of this two-dimensional arrangement of memory cells is transformed to the three-dimensional arrangement by stacking a plurality of this two-dimensional arrangement layers with use of a known method, thereby increasing the memory capacity per unit area at a low cost, that is, improving the integration degree. On each of the upper hierarchical layers, a silicon layer should preferably be deposited and diodes or selection transistors should be formed on the silicon layer.

Second Embodiment (Three-Dimensional Matrix Structure)

In this second embodiment, multiple layers having different components respectively are deposited between a pair of electrodes and a high conductivity path is formed with a voltage applied between those electrodes. Information is recorded in each object memory cell by changing the resistance value between the above pair of electrodes or between other electrodes that are disposed orthogonal to the above paired electrodes.

In this second embodiment, a region for accumulating a conductivity improving component is formed in the middle of the high conductivity path.

In this second embodiment, there are a plurality of regions for accumulating a conductivity improving component respectively between a pair of electrodes.

Each region for accumulating a conductivity improving component corresponds to recorded information.

At each phase boundary described above is formed a small lump of element used to form a high conductivity path corresponding to recorded information.

And by utilizing such a correspondence relationship, error correction can be carried out upon reading.

Figure 19:
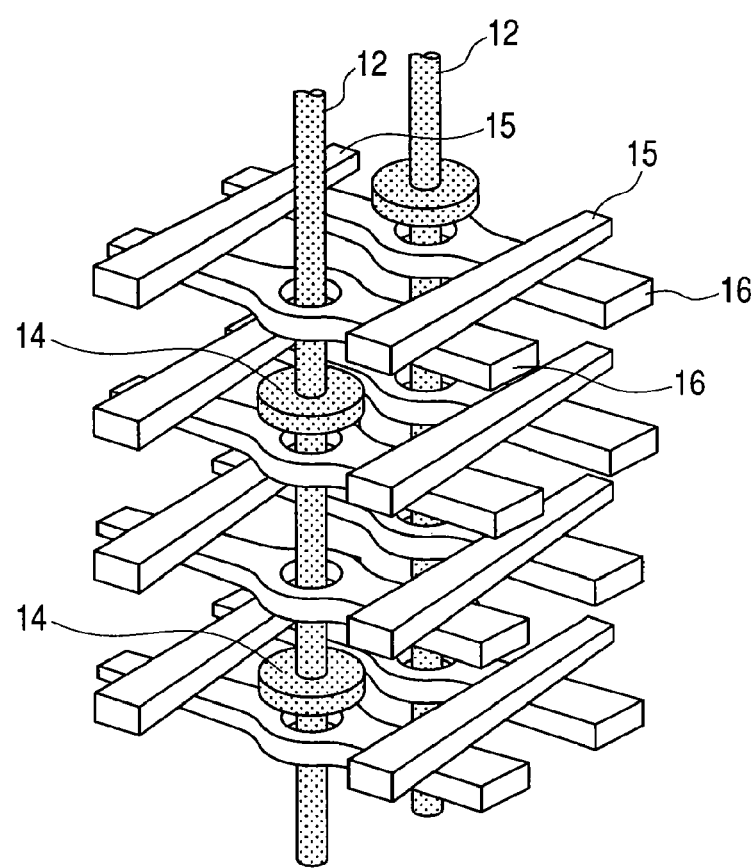
FIG. 19 is a bird's eye view of a three-dimensional matrix structure in the semiconductor device in the first embodiment of the present invention.

FIG. 19 shows a bird's-eye view of part of a three-dimensional matrix structure of memory cells included in the semiconductor device in the first embodiment of the present invention. Although not shown in FIG. 19, there are 3×4=12 solid electrolytic layers deposited in the Z-axis direction within the range of FIG. 19. Each conductive path (high conductivity region) formed between a pair of upper and lower electrodes resists the movement of a material that improves the conductivity at each phase boundary between layers, so that an ion accumulating region is formed there rather easily.

In FIG. 19, only part of the three-dimensional structure to be repeated in a wide range is shown. Each portion denoted with a spotted pattern is a region where conductive ions are concentrated. The top-shaped region accumulates ions corresponding to data. The size may be the same or different among all the top-shaped regions.

The Z-axis direction electrodes are not electrically connected to the X-axis and Y-axis direction electrodes. There are 8 through-holes formed in the Y-axis direction electrodes, through which an ion conductive path passes. The X-axis direction electrodes are used to suppress spreading of ions in the Y-axis direction. The X-axis, Y-axis, and Z-axis shown in FIG. 19 (concept figure) are not necessarily the same as their real sizes. The real sizes are scale-downed in the Z-axis in FIG. 19.

Each top-shaped region is formed so that the voltage applied to a pair of upper and lower electrodes formed in the upper and lower ends of the ion conductive path, the X-axis direction electrodes passing near the region of the conductive path, as well as the Y-axis direction electrodes cooperates with the ions' braking effect at each phase boundary (phase boundary layer) between solid electrolytic layers. At this time, ions move from up to down in FIG. 19.

In each of the layers described above, there are some electrodes, each of which is formed like a beads-screen. Each of the electrodes has a through-hole around its center and each bead is shaped like a discus. When in writing, a voltage can be applied to each of those beads-screens from both ends.

When in reading, a pair of upper and lower electrodes is selected and a voltage is applied between the selected pair to detect the existence of a region in which a resistance lowering component is accumulated or a region having an angle from a direction connecting those selected electrodes from among high conductivity paths according to the resistance value of the beads-screen-like electrode crossing its corresponding high conductivity path.

It is also preferable to have a phase boundary layer that is high in oxide or nitride concentration at the phase boundary between each pair of layers described above.

FIG. 20 shows a cross sectional view of part of the three-dimensional matrix structure of memory cells included in the semiconductor device in the first embodiment of the present invention.

Figure 20A:
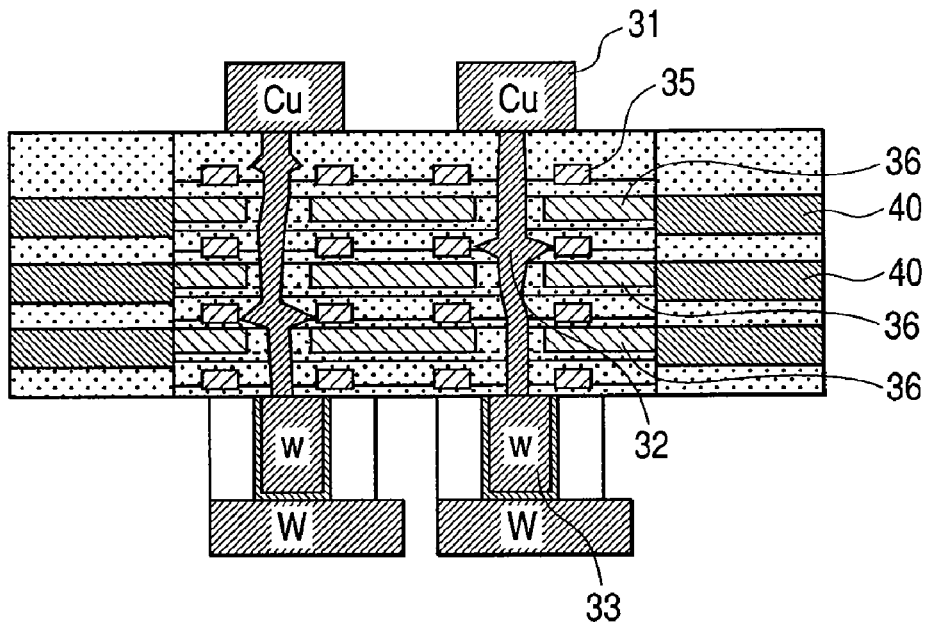
FIGS. 20A and 20B are a cross sectional view of the three-dimensional matrix structure in the semiconductor device in the first embodiment of the present invention.
Figure 20B:
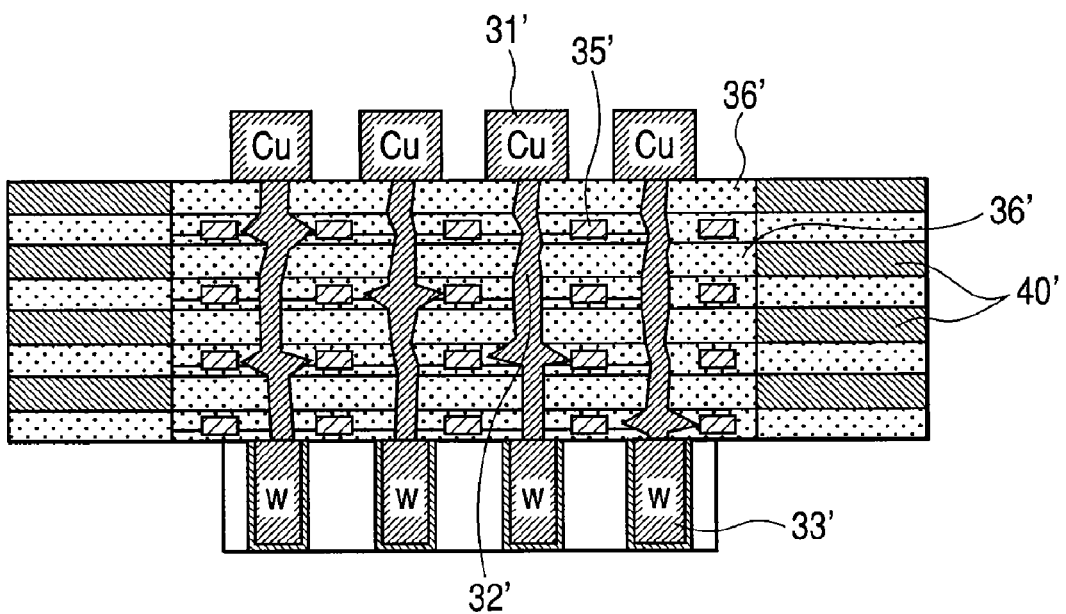

As shown in FIG. 20, when in reading, a voltage is applied between an electrode disposed at one end of a corresponding high conductivity path and one of the Y-axis direction electrodes, which passes at least near its corresponding high conductivity path, then object recorded information is detected according to the resistance value change detected as a result of the voltage application. Such a resistance value change is detected if the region for accumulating the resistivity lowering component is in contact with or close to a Y-axis direction electrode. If one electrode is provided in the Y-axis direction between two adjacent electrodes in the Z-axis direction, the case in FIG. 20A is possible and if two electrodes are provided in the Y-axis direction, the case in FIG. 20B is possible. In case of the former case in which only one electrode is provided in the Y-axis direction, the integration degree is easily raised, but the top-shaped ion accumulating region in the middle of the conductive path might reach both of the upper and lower electrodes in the X-axis direction. To prevent this, therefore, it is required to put those electrodes in two groups alternately and select one of the groups to read recorded information. Even when one electrode is provided in the Y-axis direction with respect to one conductive path and even when two electrodes are provided in the Y-axis direction with respect to one conductive path, the Y-axis direction electrodes passing both sides of the conductive path may be united into one in any other regions except in the region near the conductive path as shown in FIG. 1B or may be kept separated independently of each other as shown in FIG. 1A. When the electrode directions are united into one, the cell area can be reduced and the integrating degree can be raised easily. In FIG. 20A, the X-axis direction electrode is just one for one conductive path and the electrode has a hole through which the conductive path passes. A cross section at a vertical face including the center line drawn in the longitudinal direction is seen in FIG. 20A. In FIG. 20B, two X-axis direction electrodes are provided for one conductive path and those two electrodes pass from left to right at the front and at the back of the cross section. The number of Y-axis and X-axis electrodes provided for one conductive path may be determined optimally in accordance with the use purpose.

Preferably, the number of write pulses or the width thereof should be used to control multi-value writing.

The non-metal element components in the respective layers described above should preferably be arranged vertically just like in the order of those elements in the table of periodic law. However, a plurality of layers may have the same main element.

A layer made of metal chalcogenide and a layer made of chalcogenide having an atomic number equal to or smaller relatively than that of the metal chalcogenide or made of oxide should preferably be formed between a pair of electrodes.

The metal element contained in each layer should preferably be common at least between adjacent two layers. The driving circuit, driving method, device's lower portion forming processes, etc. are the same as those in the first embodiment.

Third Embodiment

In this third embodiment, at least part of the high conductivity path described above is formed with an angle from a direction connecting two electrodes to each other.

There should preferably be provided a plurality of regions for accumulating a conductivity improving component respectively or a plurality of portions formed so as to have an angle from a direction connecting the two electrodes between a pair of electrodes.

Figure 21:
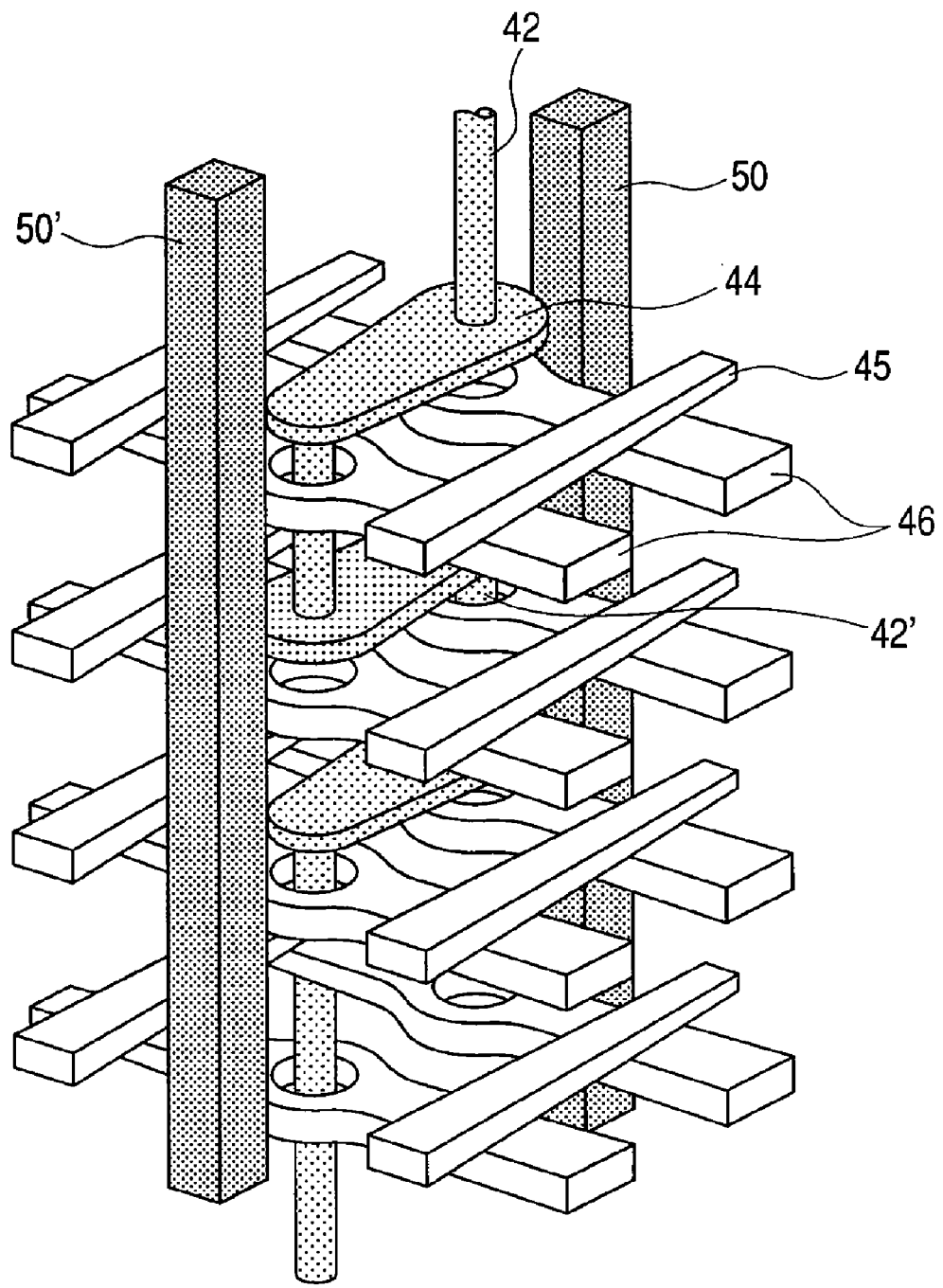
FIG. 21 is a bird's eye view of the three-dimensional matrix structure in the semiconductor device in the first embodiment of the present invention when the device includes an electrode that swings a high conductivity region in the traversal direction (Y-axis direction)

In case of a typical structure in this third embodiment, as shown in FIG. 21, electrodes 50 and 50' are provided to apply a voltage in a direction having an angle from the direction connecting the two electrodes to each other. This means that two parallel electrodes that pass through each layer are provided for each of the above paths in parallel to a high conductivity path.

In this third embodiment, a phase boundary between a direction of a high conductivity path, which connects two electrodes to each other and a portion having an angle from the direction corresponds to recorded information.

For example, when in recording digital data, '0' means extension of a high conductivity path through an object layer and '1' means, for example, extension of the high conductivity path that is parallel to the plane to the right, then extension of a high conductivity region toward the counterpart electrode. If the next value is also '1', the voltage is applied between the electrodes 50 and 50' disposed horizontally so as to extend the high conductivity path to the left. In such a way, in case of '1', the high conductivity path is swung to the right and left alternately and extended in a zigzag pattern. On the contrary, in case of '0', the high conductivity path is swung to the right and left alternately and in case of '1', the high conductivity path may be extended straight. It should be more preferably to convert digital data according to the conversion rule before recording the object data. For example, if the (2, 7) modulation, 8-16 modulation, or the like employed for optical disks is used, it is possible to put '0' between two '1''s. In this case, when '1' comes, the '1' is never followed by another '1'. Thus it is just required here to swing the subject path to the right or left.

To swing a subject high conductivity path to the right and left as described above, Y-axis or X-axis direction electrodes may be used instead of the pair of electrodes 50 and 50'. In this case, a potential difference is given to the Y-axis or X-axis direction electrodes passing both sides (right and left) of the subject high conductivity path.

Operations are stabilized if a small element lump is formed at the phase boundary described above and used to form a high conductivity path corresponding to recorded information.

When in reading, errors should be collected just like the error collection carried out in optical disks by utilizing the relationship of correspondence as described above, When in reading, the method in the first embodiment can be employed as is; the phenomenon that ions are more accumulated in swung portions is utilized. If the number of bits in the Z-axis direction is less, reading may be made according to the difference of the resistance, electric capacity, and electromotive force size between the conductive path and each of the electrodes 50 and 50' in the Z-axis direction. In this case, signal conversion should preferably be made before writing so as to make it easy to detect and correct errors. In this embodiment, recorded information is read according to the electric resistance, capacity, or electromotive force corresponding to the number in each of the right and left portions to which the conductive path is swung.

The driving circuit, driving method, and device's lower portion forming processes are the same as those in the first embodiment.

(Brain Type Memory and Switch)

The functions of the semiconductor device in this third embodiment resemble the mnemonic functions of the cerebral cortex in that the strength of the connection of each part of a wiring is related to recording of information. The semiconductor device corresponds to the mnemonic portion of a kind of cerebral type computer. The semiconductor device can also carry out simple logic processes in selection/switching between connecting directions. In case of such a cerebral type computer, a circuit corresponding to a nerve cell drives a switch. Just like an actual nerve cell, an input portion should preferably be provided between an input and an output of a circuit corresponding to the nerve cell. The input portion inputs, for example, a signal corresponding to a neurotransmitter from a glia cell and a feedback signal from an upper hierarchical layer, such as a DC bias, and a pulse waveform supplied from outside the nerve cell circuit in some cases. More preferably, a plurality of such input portions should be provided and one of those input portions is used as an input to a comparator that determines a threshold value for nerve cells. A plurality of nerve cell circuits corresponding to letters are arranged in parallel, then those circuits are arranged serially so as to correspond to a sentence, thereby relating them to the symbols (squares, diamond shapes, etc.) of each flowchart. And in order to represent relationships between inputs and outputs to and from those nerve cell circuits with symbols in processes, preferably recorded processed contents are read by tuning on/off the switches of the present invention and those read contents are transferred as electric signals to the input provided between the circuits corresponding to the nerve cells respectively as described above.

In such a case, at least a conductive path can be divided or two conductive paths can be united on the way, so that the semiconductor device comes to further resemble the intracerebral states. And because a voltage applied to each Y-axis direction electrode can control the direction of the subject conductive path, switching, branching, and joining are enabled.

Figure 22A:
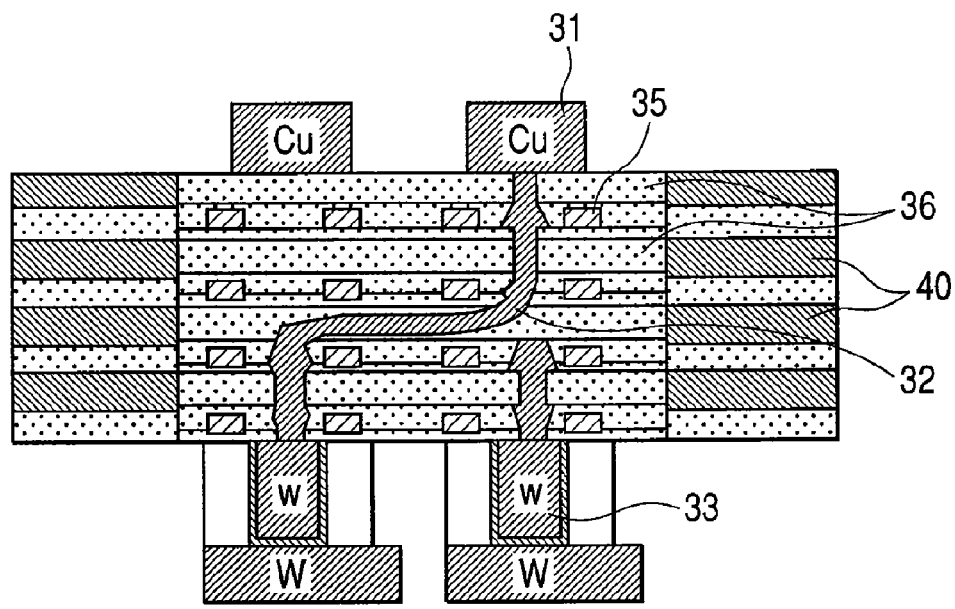
FIGS. 22A and 22B are a cross sectional view of the three-dimensional matrix structure in the semiconductor device in the first embodiment of the present invention when the high conductivity region is swung in the traversal direction (Y-axis direction) to be switched/branched.
Figure 22B:
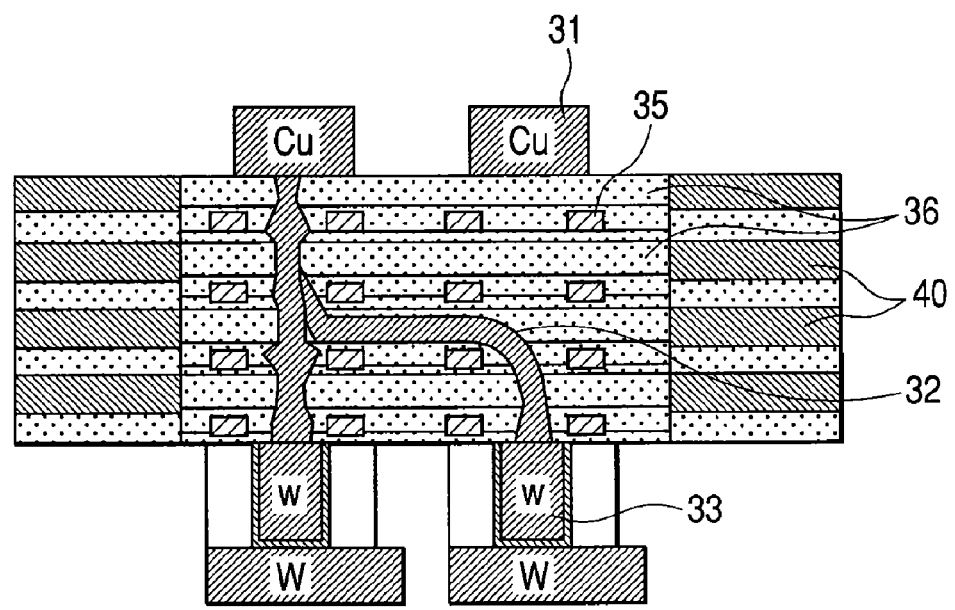

FIG. 22A shows an example of such switching. FIG. 22B shows an example of such branching. In case of the switching, a conductive path that functions as a switch joins in another conductive path from an upper electrode if it exists in the destination path. In those cases shown in FIGS. 22A and 22B, each X-axis direction electrode has a hole through which a bent conductive path can pass easily, but the X-axis direction electrodes do not pass the conductive path and those X-axis direction electrodes are divided into two lines at both sides of the conductive path. Logic processings are carried out through feedback or feedforward of the subject electrode voltage. It is also possible to provide a digital logic circuit and an analog circuit in the middle of a subject conductive path to enable high grade processings. This semiconductor device has a merit that a circuit to be switched over (a circuit in the Z-axis direction) and a driving circuit (a circuit for applying a voltage to Y-axis or X-axis direction electrodes) can be separated just like a mechanical switch that uses electromagnets and contacts.

In FIG. 22, in order to extend a conductive path horizontally for enabling a switching operation, a traversal electric field that pulls the conductivity improving component (Cu ions or the like) horizontally, then a downward electric field are applied to the X-axis direction electrode passing near the subject conductive path, then to the Y-axis direction electrode. If a downward electric field that pulls down the original conductive path before pulling in the traversal direction is also applied to those electrodes, the conductive path is branched. When forming a conductive path that is not connected to the upper electrode in the example shown in FIG. 22, it is recommended to form a conductive path reaching the lower electrode from the upper electrode, then to disconnect the conductive path from the lower electrode by applying a voltage pulse between the upper electrode and another electrode in the middle portion in the X-axis or Y-axis direction. The conductive path may also be disconnected from the lower electrode naturally with an electric field applied when in switching or branching.

Fourth Embodiment

Figure 23:
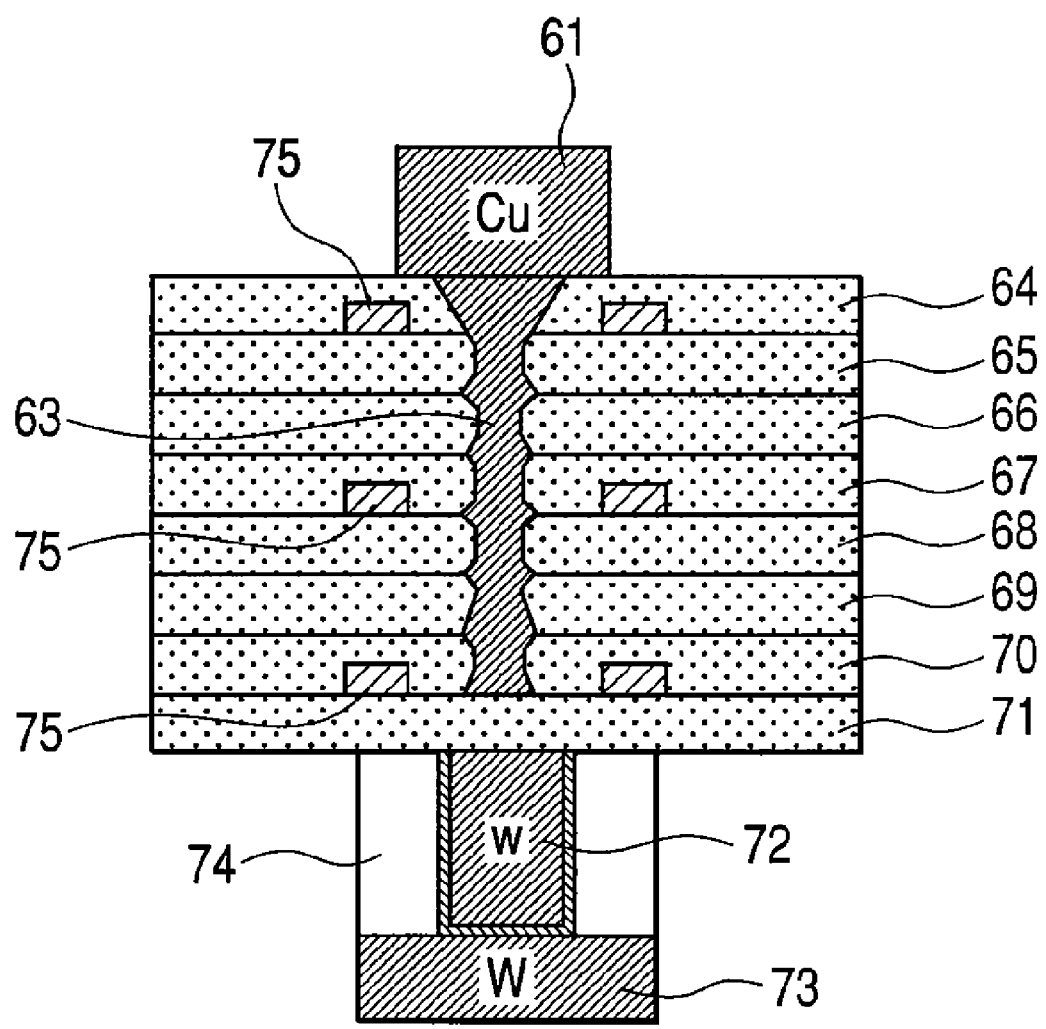
FIG. 23 is an explanatory cross sectional view of a memory element corresponding to multi-value recording when the memory element includes a solid electrolytic layer for each layer having a resistance value different from those of other layers in a semiconductor device in another embodiment of the present invention.

In this fourth embodiment, the resistance value differs among solid electrolytic layers as shown in FIG. 23. For example, the resistance value is varied by the unit of a multiple of twice or more like 2 kΩ, 5 kΩ, and 25 kΩ. Other items are the same as those in the first or second embodiment. In this case, if a conductivity improving component is used to short layers sequentially to control the resistance with multiple values to record information, there is not always required to form the region for accumulating a conductivity improving component.

The driving circuit, driving method, and device's lower portion forming processes are the same as those in the first embodiment.

Fifth Embodiment

In this fifth embodiment, the structure shown in FIG. 23 is employed and an ion accumulating region is formed near a phase boundary between layers and the resistance value is varied for each layer. And an ion accumulating region is formed at both phase boundaries of a layer and those ion accumulating regions at both phase boundaries are shorted with an ion conductive path therebetween, thereby layers can be shorted with less variation. As a result, even when the resistance value is the same among layers or even when the resistance value is not varied so much for each layer, recorded information can be read correctly. For example, the resistance value is changed by the unit of a multiple of twice or more like 2 kΩ, 5 kΩ, and 25 kΩ. Other items are the same as those in the first or fourth embodiment. As shown in FIG. 23, if Y-axis direction electrodes, as well as X-axis direction electrodes as needed are formed at one or more phase boundaries, more correct controlling is possible. However, forming of those electrodes is not indispensable.

While the preferred form of the present invention has been described, it is to be understood that modifications will be apparent to those skilled in the art without departing from the spirit of the invention.

The semiconductor integrated circuit device of the present invention can apply widely to various devices such as memory devices, each of which includes memory cells rewritable with a voltage in one direction and made of a resistance variable material, highly integrated memory devices capable of multi-bit recording in the film thickness direction respectively, logic-mixed type memory devices having a memory circuit and a logic circuit on one semiconductor substrate respectively, etc. The semiconductor integrated circuit device is advantageous in cost reduction and when such a device is used at low power consumption, the advantage will become more remarkable.

What is claimed is:

1. A semiconductor device, comprising:
   a first electrode formed on a semiconductor substrate;
   a second electrode formed on the semiconductor substrate so as to face the first electrode; and
   a laminated film formed between the first and second electrodes and consisting of at least two stacked solid electrolytic layers of which components differ from each other,
   wherein the first electrode includes a metal to be diffused in the solid electrolytic layer so as to form a low resistance conductive path therein;
   wherein the solid electrolytic laminated film is formed so that the mobility of the solid electrolytic layer closer to the first electrode with respect to the metal becomes higher than that of the solid electrolytic layer closer to the second electrode with respect to the metal,
   wherein the device includes a plurality of pairs of the first and second electrodes,
   wherein the low resistance conductive path has an angle deviated from a direction in which the pair of first and second electrodes are connected to each other at least in its middle portion,
   wherein the device includes a plurality of said low resistance conductive paths,
   wherein the device further includes means that switches or branches one of said low resistance conductive paths to another of said low resistance conductive paths having a different angle, and
   wherein the switching means is provided in each solid electrolytic layer and has a pair of electrodes that are disposed so as to sandwich a conductor path therebetween.

2. The semiconductor device according to claim 1,
wherein a direction of each said low resistance conductive path formed in the solid electrolytic laminated layer connecting the first and second electrodes to each other is assumed as a Z-axis direction; and
wherein an X-axis direction electrode is formed at one side or both sides of the low resistance conductive path so as to sandwich the low resistance conductive path therebetween in the X-axis direction that is approximately orthogonal to the Z-axis direction.

3. The semiconductor device according to claim 2,
wherein the device further includes means that applies a voltage to the x-axis direction electrode, thereby controlling the resistance value of the conductor path.

4. The semiconductor device according to claim 2,
wherein Y-axis direction electrodes are disposed at both sides of the low resistance conductive path so as to sandwich the low resistance conductive path therebetween in the Y-axis direction that is approximately orthogonal to the X-axis and Z-axis directions respectively.

5. The semiconductor device according to claim 4,
wherein the device further includes means that keeps the distribution of a conductivity improving material accumulated in the low resistance conductive path in a constant state when a voltage is applied to at least either the X-axis or Y-axis direction electrode to repetitively raise and lower the resistance value of the low resistance conductive path.

6. The semiconductor device according to claim 4,
wherein the means that keeps the constant state is the X-axis direction electrode disposed near an end of the low resistance conductive path around either the first or the second electrode.

7. The semiconductor device according to claim 4,
wherein code conversion is carried out each time information is to be recorded in the low resistance conductive path so that the average value of recorded information is almost fixed in each memory cell, thereby avoiding that the conductivity improving material is accumulated unevenly among memory cells after multiple rewriting operations of information recorded in the low resistance conductive path.

8. The semiconductor device according to claim 4,
wherein a voltage is applied between an electrode disposed at either end of a corresponding low resistance conductive path and a Y-axis direction electrode provided near the low resistance conductive path upon reading information stored in the low resistance conductor path, thereby detecting the stored information according to the value of the resistance between those electrodes.

9. The semiconductor device according to claim 4,
wherein a voltage is applied to a Y-axis direction electrode disposed near a corresponding low resistance conductive path upon reading information stored in the low resistance conductive path, thereby detecting information stored in the low resistance conductive path according to an electromotive force generated in the X-axis direction electrode.

10. The semiconductor device according to claim 4,
wherein a voltage is applied to a corresponding low resistance conductive path upon reading information stored in the low resistance conductive path, thereby detecting information stored in the low resistance conductive path according to the electromotive force generated in the X-axis direction electrode or Y-axis direction electrode disposed near the low resistance conductive path.

11. The semiconductor device according to claim 4,
wherein the device further includes means that controls the resistance between the pair of electrodes or a pair of electrodes disposed closely to the pair of electrodes, with use of multiple values according to the number of write pulses or the pulse width.

12. The semiconductor device according to claim 1,
wherein the device further includes a region that accumulates a conductivity improving material in the middle of the low resistance conductive path; and
wherein the device further includes means that relates the resistance value in the conductivity improving material accumulating region to an information signal, thereby identifying the information signal according to the resistance value.

13. The semiconductor device according to claim 1,
wherein a phase boundary region between the low resistance conductor path and the region having an angle from the low resistance conductive path functions as an information memory.

14. A semiconductor device, comprising:
a first electrode provided on a semiconductor substrate and having a first conductivity;
a second electrode provided on the semiconductor substrate so as to face the first electrode and having a second conductivity; and
a laminated film formed between the first and second electrodes and consisting of at least two stacked solid electrolytic layers,
wherein the first electrode includes a metal to be diffused in the solid electrolyte laminated layer to form a low resistance path therein; and
a phase boundary layer provided between each pair of solid electrolyte layers and having mobility lower than that of each of the first and second solid electrolyte layers.

15. The semiconductor device according to claim 14,
wherein the phase boundary layer is 1 nm to 10 nm in film thickness.

16. The semiconductor device according to claim 14;
wherein at least one of the phase boundary layers between the pairs of solid electrolyte layers respectively has a phase boundary layer of which oxygen or nitrogen concentration is high.

17. A semiconductor device, comprising:
a first electrode provided on a semiconductor substrate and having first mobility;
a second electrode provided on the semiconductor substrate so as to face the first electrode and having second mobility; and
a laminated film formed between the first and second electrodes and consisting of at least two stacked solid electrolyte layers,
wherein the first electrode includes a metal to be diffused in the solid electrolyte layer to form a low resistance path therein,
wherein the first electrode is made of Cu and the second electrode is made of W or Pt,
wherein a phase boundary layer made of $Al_2O_3$ is formed between two of said stacked solid electrolyte layers, and
wherein the solid electrolyte laminated layer is a multilayer film consisting of a chalcogenide layer containing Cu—Ta—O and a chalcogenide layer containing Cu—Ta—S.

18. The semiconductor device according to claim 17,
wherein the first electrodes is made of an oxide containing Cu or chalcogenide;
wherein the second electrode is made of at least one element selected from a group consisting of W, Ta, Mo, Nb, Cr, Ni, Co, Ti, and Pt group elements, as well as Ti nitride.

* * * * *